(12) United States Patent
Yuan et al.

(10) Patent No.: US 9,312,010 B1
(45) Date of Patent: Apr. 12, 2016

(54) PROGRAMMING OF DRAIN SIDE WORD LINE TO REDUCE PROGRAM DISTURB AND CHARGE LOSS

(71) Applicant: SanDisk Technologies Inc., Plano, TX (US)

(72) Inventors: Jiahui Yuan, Fremont, CA (US); Yingda Dong, San Jose, CA (US); Ching-Huang Lu, Fremont, CA (US); Wei Zhao, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/508,164

(22) Filed: Oct. 7, 2014

(51) Int. Cl.
G11C 16/04 (2006.01)
G11C 16/10 (2006.01)
G11C 16/34 (2006.01)

(52) U.S. Cl.
CPC ............ G11C 16/10 (2013.01); G11C 16/0466 (2013.01); G11C 16/0483 (2013.01); G11C 16/3427 (2013.01); G11C 16/3459 (2013.01)

(58) Field of Classification Search
CPC ... G11C 16/0483; G11C 16/10; H01L 27/115
USPC ............................ 365/185.17, 185.22, 185.24
See application file for complete search history.

(56) References Cited

U.S. PATENT DOCUMENTS

| | | | |
|---|---|---|---|
| 7,218,552 B1 | 5/2007 | Wan et al. | |
| 8,117,375 B2 | 2/2012 | Sarin et al. | |
| 8,230,165 B2 | 7/2012 | Han | |
| 8,553,465 B2 | 10/2013 | Park | |
| 8,804,425 B2 | 8/2014 | Chen et al. | |
| 2005/0276112 A1 | 12/2005 | Kido et al. | |
| 2007/0109854 A1 | 5/2007 | Shibata | |
| 2008/0019188 A1* | 1/2008 | Li | G11C 8/10 365/185.22 |
| 2008/0086631 A1 | 4/2008 | Chow et al. | |

OTHER PUBLICATIONS

Choi, Byung Yong, et al., "New Source/Drain Hot Carrier Injection Disturbance of NAND Flash Devices," Journale of the Korean Physical Society, vol. 56, No. 1, Jan. 2010, pp. 142-146.
U.S. Appl. No. 14/472,889, filed Aug. 29, 2014.
International Search Report & The Written Opinion of the International Searching Authority dated Jan. 7, 2016, International Application No. PCT/US2015/051275.

* cited by examiner

*Primary Examiner* — Jason Lappas
(74) *Attorney, Agent, or Firm* — Vierra Magen Marcus LLP

(57) ABSTRACT

Techniques are provided for programming the memory cells of a drain-side edge word line of a set of word lines before programming memory cells of any other word line of the set. Pass voltages applied to the other word lines act as stress pulses which redistribute holes in the charge-trapping material of the memory cells of the other word lines to reduce short-term charge loss and downshifting of the threshold voltage. Additionally, one or more initial program voltages used for the drain-side edge word line are relatively low and also act as stress pulses. The memory cells of the drain-side edge word line are programmed to a narrower Vth window than the memory cells of the other word lines. This compensates for a higher level of program disturb of erased state memory cells of the drain-side edge word line due to reduced channel boosting.

15 Claims, 20 Drawing Sheets

Fig. 1C

Code in storage device (150)

boot code (151)

control code / set of instructions (160)

instructions to program memory cells connected to a drain-side word line (162)

instructions to apply a first set of step-wise increasing program voltages to the drain-side word line (162a)

instructions to perform fast and slow programming modes (162b)

instructions to program memory cells connected to another word line (170)

instructions to apply a second set of step-wise increasing program voltages to the another word line (170a)

instructions to perform fast programming mode (170b)

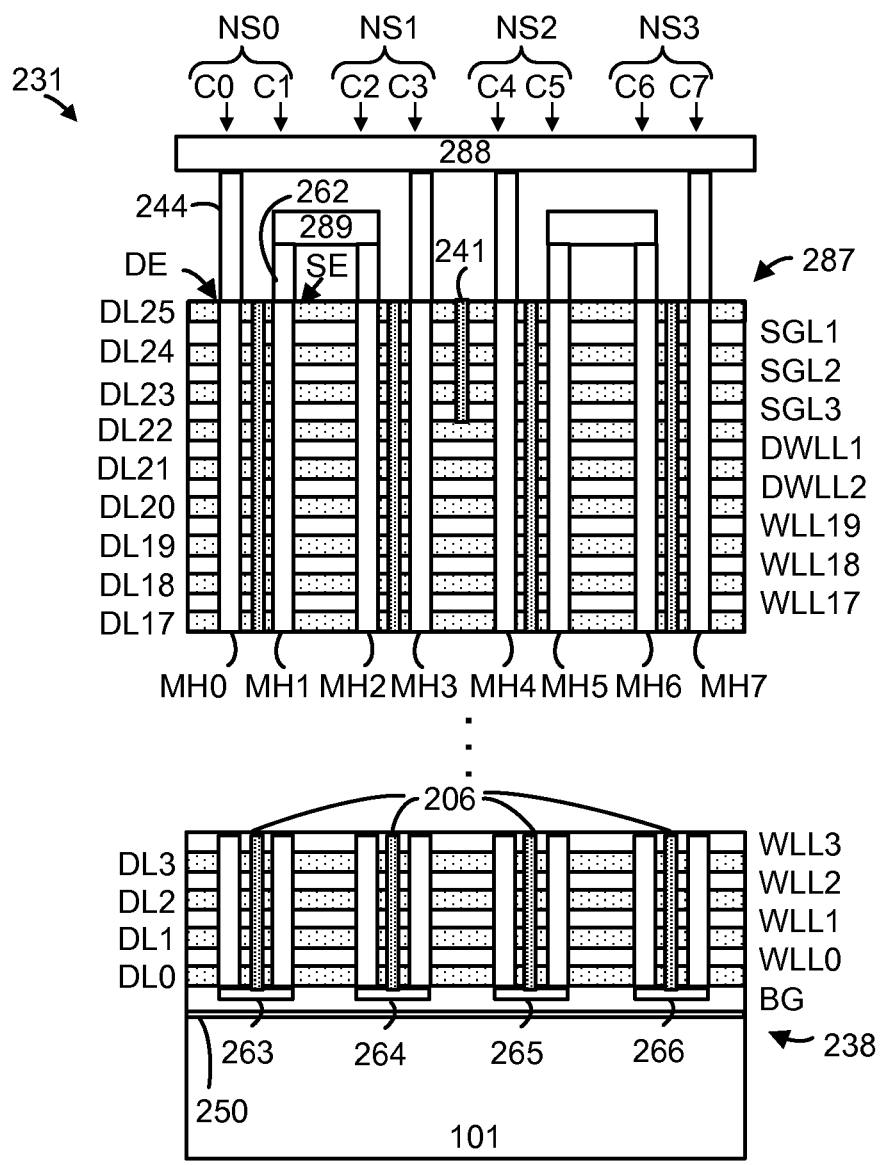

Fig. 7A
Fig. 7B
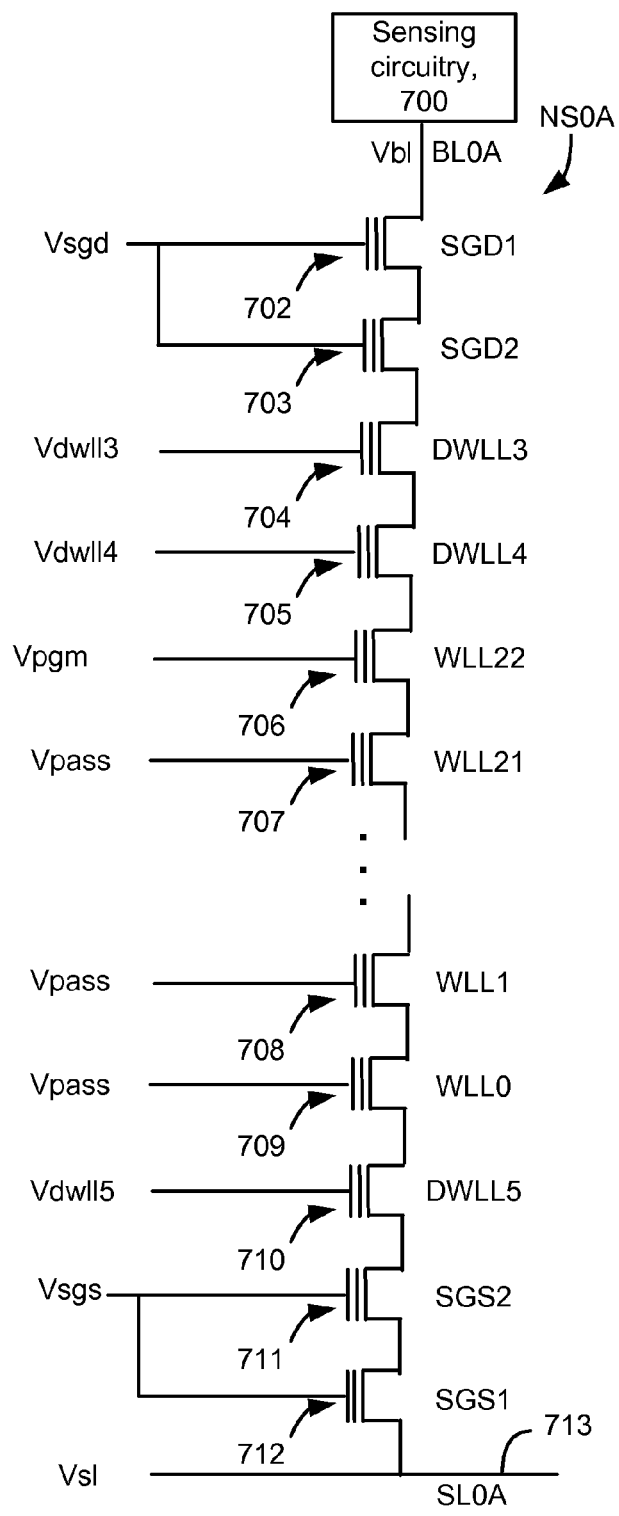
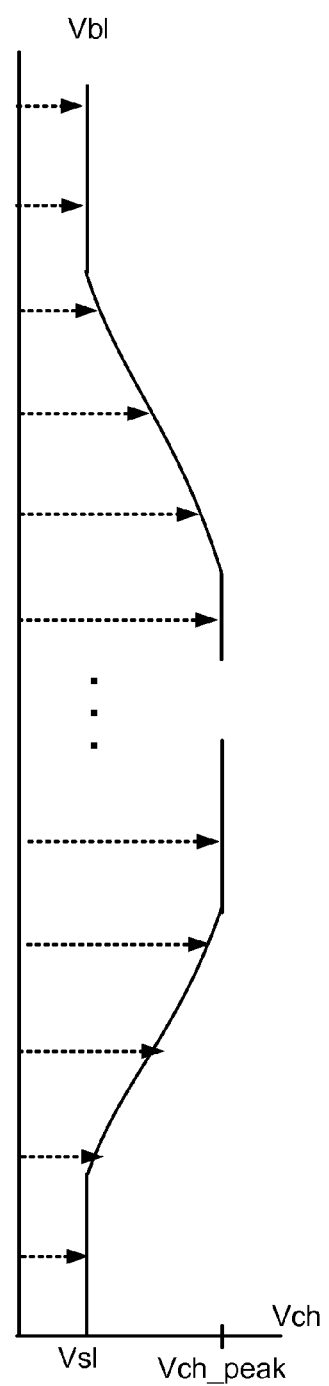

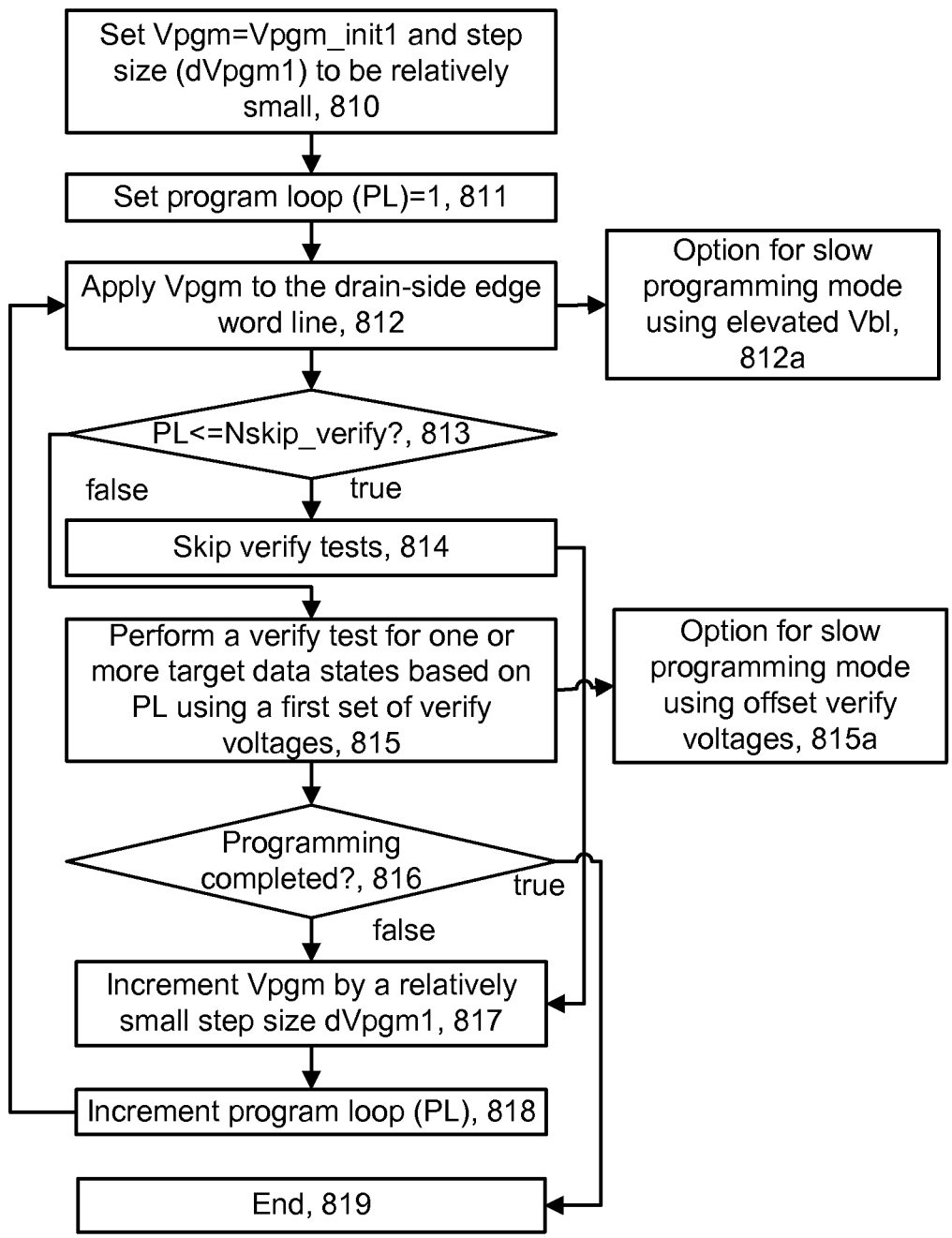

PROGRAMMING OF DRAIN SIDE WORD LINE TO REDUCE PROGRAM DISTURB AND CHARGE LOSS

BACKGROUND

The present technology relates to operation of memory devices.

A charge-trapping material can be used in memory devices to store a charge which represents a data state. The charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

However, various challenges are presented in operating such memory devices.

BRIEF DESCRIPTION OF THE DRAWINGS

Like-numbered elements refer to common components in the different figures.

FIG. 1C depicts code which may be executed by a processor.

FIG. 2C depicts an embodiment of a stack 231 showing a cross-sectional view of the portion 209 of FIG. 2A, along line 220.

FIG. 7A depicts a circuit diagram of a NAND string consistent with the memory devices of FIGS. 2C and 3C.

FIG. 7B depicts channel boosting along a height of the NAND string of FIG. 7A.

FIG. 8B depicts an example of step 801 of FIG. 8A for programming data into memory cells connected to a drain-side edge word line.

DETAILED DESCRIPTION

Figure 1A:
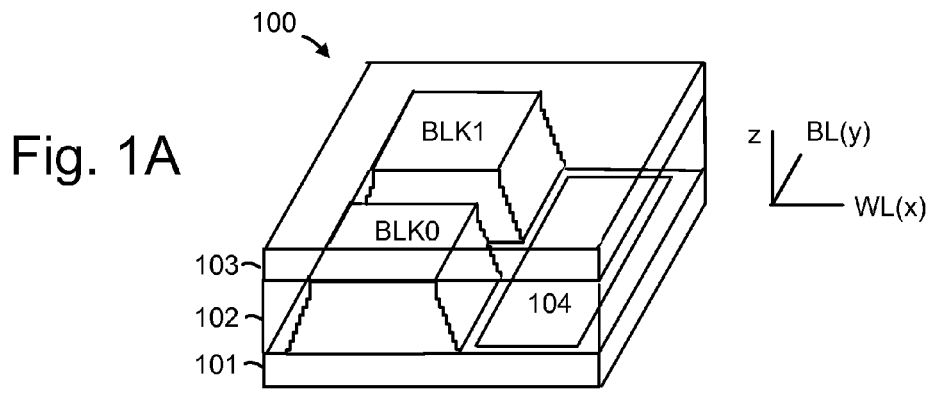
FIG. 1A is a perspective view of a 3D stacked non-volatile memory device.

Techniques are provided for reducing program disturb and short-term charge loss in charge-trapping memory.

A charge-trapping memory device may use a charge-trapping material such as silicon nitride layer which is arranged between oxide layers (e.g., in an oxide-nitride-oxide or ONO configuration) next to a channel region. One example of a charge-trapping memory device is a 3D memory device in which a stack of alternating conductive and dielectric layers are formed. Memory holes are etched in the stack and films are deposited in the holes and/or spaces used to provide the conductive layers such that memory cells or select gate transistors are formed where the conductive layers intersect with the memory holes. The films include a charge-trapping layer which extends vertically along an individual cell or an entire NAND string. Some of the conductive layers are used as control gates for memory cells and other conductive layers are used as control gates for select gate transistors, such as drain or source side transistors in NAND strings. Another example of a charge-trapping memory device is a 2D memory device in which the charge-trapping layer extends horizontally along a NAND string.

During programming of a charge-trapping memory cell, electrons move from the channel to the nitride layer. However, a short-term charge loss occurs due to fast charge de-trapping from shallow traps in the ONO layers into the channel. This can occur a few seconds or minutes after a memory cell has completed programming to a target data state according to a verify test. As a result of the charge loss, the lower tails of the threshold voltage (Vth) distributions of the memory cells can decrease to the point where the target data state cannot be accurately read back from the memory cell. Generally, the charge loss causes a set of cells to have a widened Vth distribution which has downshifted below the verify voltages.

Short-term charge loss is believed to be caused by holes which are trapped in the upper portion of the charge-trapping material, which is a portion of the charge-trapping material which is furthest from the channel. After programming, the holes are thermally activated to the valence band and diffuse away to the lower portion of the charge-trapping material, which is a portion of the charge-trapping material which is closest to the channel, thereby lowering the Vth. Thus, there is a redistribution of the holes in the charge-trapping material which results in a lowering of the Vth.

A further problem occurs in that the memory cells in the erased state experience program disturb due to the programming of the other memory cells. Program disturb occurs due to capacitive coupling from one memory cell (an attacker) to another, neighboring memory cell (a victim) when the attacker has a higher Vth than the victim. Program disturb is proportional to the difference between the Vth of the attacker and the victim. Program disturb is therefore greatest when the victim is an erased state cell and the attacker is in the highest target data state. The attacker can be adjacent to the victim in the same NAND string, or on the same word line, or diagonally adjacent on an adjacent NAND string and word line. Another factor which affects program disturb is whether the victim cell is in a selected NAND string (in which a memory cell is being programmed) or unselected NAND string (in which no memory cell is being programmed). For a victim cell in a selected NAND string, the channel is typically grounded so that no boosting is present to reduce capacitive coupling from the attacker and program disturb is strong. For a victim cell in an unselected NAND string, the channel is boosted to reduce capacitive coupling from an attacker. However, the amount of channel boosting can be weaker for the drain-side memory cell of the NAND string which is connected to a drain-side edge word line, compared to other memory cells in the NAND string. As explained in FIG. 7B, the channel boosting is lower for the memory cells of a drain-side edge word line due to a transition to a lower boosting level under the dummy word lines and select gate transistors. As a result, program disturb is stronger for the drain-side memory cells than for other memory cells.

Program disturb causes the upper tail of the Vth distribution of the erased memory cells to increase, so that some of the disturbed erased state cells may be incorrectly read back as being in the lowest target data state, e.g., the A state. This is in conflict with the need to provide narrow Vth distributions which allow multiple data states to be stored and read back accurately.

Techniques provided herein involve programming the memory cells of the drain-side edge word line before programming memory cells of any other word line of a set of word lines, such as in a block. During programming, program voltages are applied to the drain-side edge word line while pass voltages are applied to the other word lines which act as stress pulses which redistribute holes in the charge-trapping material of the memory cells of the other word lines to reduce short-term charge loss. Pass voltages are also applied to the other word lines during verify tests of the drain-side edge word line. As a result, there will be a reduced amount of redistribution of the holes after programming of the memory cells of the other word lines. The pass voltage provides an electron flux in the charge-trapping material which recombines with the holes and mitigates the subsequent hole redistribution in the charge-trapping material after programming.

Additionally, one or more initial program voltages used in programming the memory cells of the drain-side edge word line are relatively low (compared to initial program voltages used in programming of the other word lines) so that these program voltages will also act as stress pulses before the memory cells begin to reach the lowest target data state. This reduces charge loss in these memory cells as well.

Furthermore, the memory cells of the drain-side edge word line are programmed to a narrower Vth window than the memory cells of the other word lines to provide a sufficient margin between the Vth of the disturbed erased state memory cells and the Vth of the memory cells in the lowest target data state. This narrower Vth distribution can be achieved using, e.g., a relatively low initial program voltage, a relatively low step size for the program voltage, a relatively short program pulse duration and/or a slow programming mode in which an elevated bit line voltage is used when the memory cells reach an offset verify voltage which is below the final verify voltage of a target data state.

The following discussion provides details of the construction of example memory devices and of related techniques which address the above and other issues.

FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
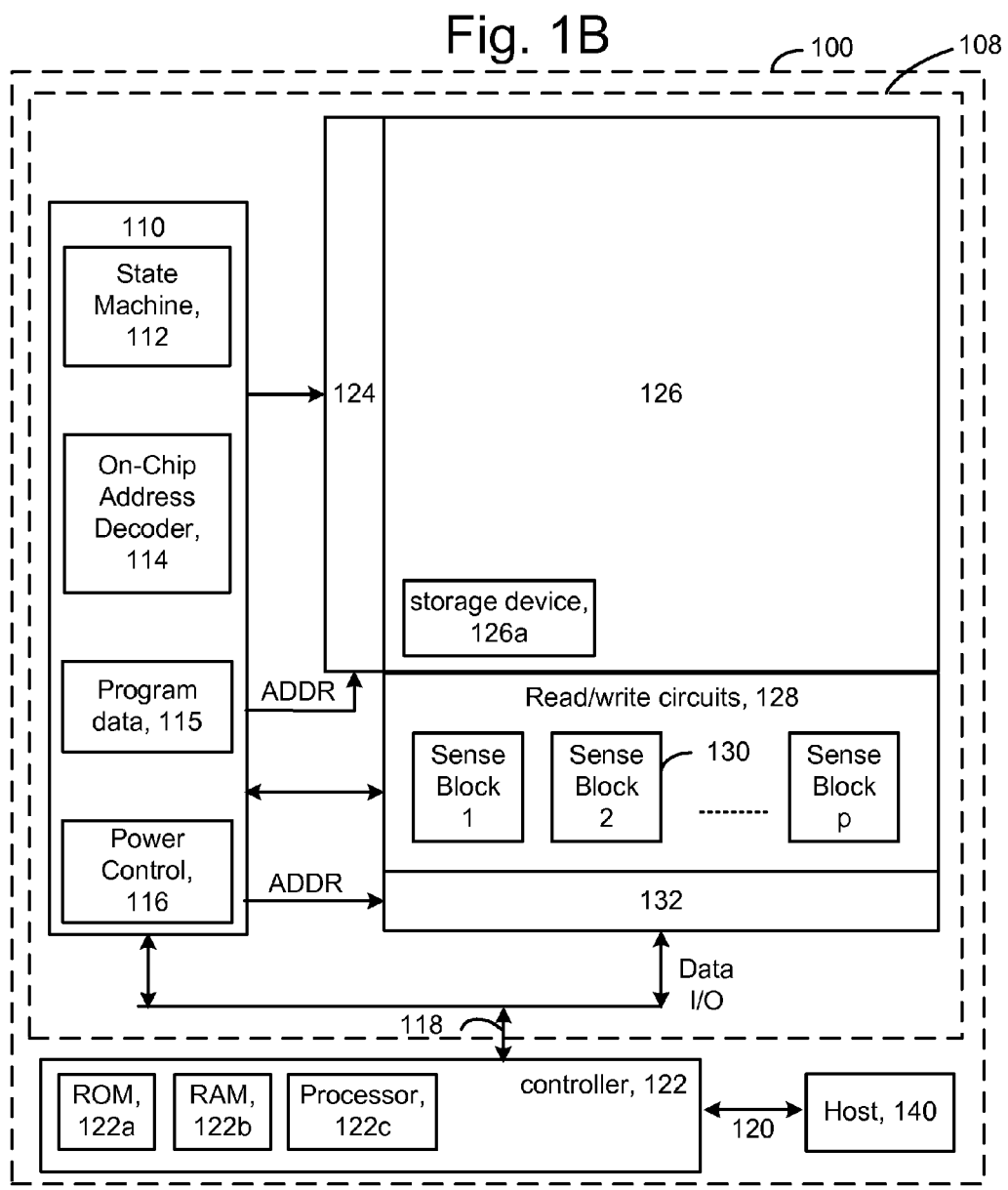
FIG. 1B is a functional block diagram of a memory device such as the 3D stacked non-volatile memory device 100 of FIG. 1A.

FIG. 1B is a functional block diagram of a memory device such as the 3D stacked non-volatile memory device 100 of FIG. 1A. The memory device 100 may include one or more memory die 108. The memory die 108 includes a memory structure 126 of memory cells, such as an array of cells, control circuitry 110, and read/write circuits 128. In a 3D configuration, the memory structure can include the blocks BLK0 and BLK1 of FIG. 1A. The memory structure 126 is addressable by word lines via a row decoder 124 and by bit lines via a column decoder 132. The read/write circuits 128 include multiple sense blocks 130 (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via lines 120 and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 115 may be provided for program data such as verify voltages, step size, program pulse width and initial Vpgm.

The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers (WLLs) in a 3D configuration, SGS and SGD transistors and source lines. The sense blocks 130 can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks 130, read/write circuits 128, and controller 122, and so forth.

The off-chip controller 122 may comprise a processor 122c and storage devices (memory) such as ROM 122a and RAM 122b. The storage devices comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, FIG. 1C depicts code which may be executed by the processor 122c. The code 150 is used by the controller to access the memory structure such as for programming, read and erase operations. The code can include boot code 151 and control code (set of instructions) 160. The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

The control code further includes instructions to program memory cells connected to a drain-side word line (162), including instructions to apply a first set of step-wise increasing program voltages to the drain-side word line (162a), and instructions to perform fast and slow programming modes (162b). The control code also includes instructions to program memory cells connected to another word line (170), including instructions to apply a second set of step-wise increasing program voltages to the another word line (170a) and instructions to perform fast programming mode (170b). The control code can include instructions to perform the functions described herein including the steps of the processes of FIG. 8A to 8C.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figures 2A, 2B:
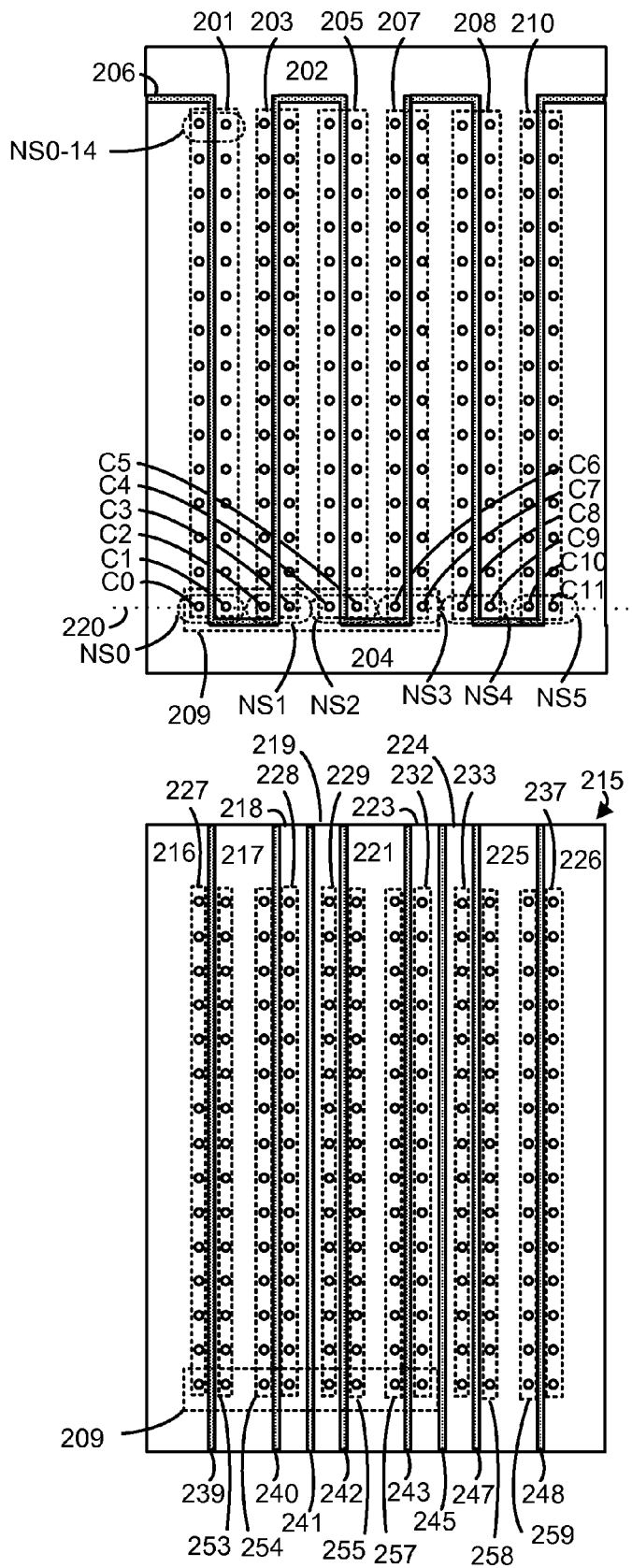
FIG. 2A depicts a top view of example word line layers 202 and 204 in a U-shaped NAND embodiment, as an example implementation of BLK0 in FIG. 1A.
FIG. 2B depicts a top view of example select gate layer portions, consistent with FIG. 2A.

FIG. 2A depicts a top view of example word line layers 202 and 204 in a U-shaped NAND embodiment, as an example implementation of BLK0 in FIG. 1A. In a 3D stacked memory device, memory cells are formed along memory holes which extend through alternating conductive and dielectric layers in a stack. The memory cells are typically arranged in NAND strings. Each conductive layer can include one or more word line layers. A word line layer is an example of a word line.

The view is of a representative layer among the multiple WLLs in a stack. Referring also to FIG. 2C, the stack includes alternating dielectric and conductive layers. The dielectric layers include DL0 to DL25 and may be made of SiO2, for instance. The conductive layers include a back gate layer (BGL), data-storing word line layers WLL0 to WLL19, dummy (non-data-storing) word line layers DWLL1 and DWLL2, and select gate layers SGL1, SGL2 and SGL3. The word line layers are conductive paths to control gates of the memory cells at the layer. Moreover, each select gate layer may comprises conductive lines to select gate transistors (e.g., SGD and/or SGS transistors).

Data memory cells are eligible to store user or system data while dummy memory cells are ineligible to store user or system data.

The word line layers of FIG. 2A may represent any one of the word line layers in FIG. 2C. These conductive layers may include doped polysilicon or metal such as tungsten or metal silicide, for instance. An example voltage of 5-10 V may be applied to the back gate to maintain a conductive state which connects the drain- and source-side columns.

For each block, each conductive layer may be divided into two word line layers 202 and 204 which are insulated from one another by a slit 206. See also FIG. 2D. The slit is formed by etching a void which extends vertically in the stack, typically from an etch stop layer at the bottom to at least a top layer of the stack, then filling the slit with insulation. This is an example of the type of etching which can result in the accumulation of charges in the top conductive layer of the stack. The slit 206 is a single continuous slit which extends in a zig-zag pattern in the block. This approach can provide greater flexibility in controlling the memory cells since the WLLs can be driven independently.

Each block includes memory holes or pillars which extend vertically in the stack, and comprise a column of memory cells such as in a NAND string. Each circle represents a memory hole or a memory cell associated with the word line layer. Example columns of memory cells along a line 220 include C0 to C11. Columns C0, C3, C4, C7, C8 and C11 represent the drain side columns of respective NAND strings. Columns C1, C2, C5, C6, C9 and C10 represent the source side columns of respective NAND strings. The figure represents a simplification, as many more rows of memory holes will typically be used, extending to the right and left in the figure. Also, the figures are not necessarily to scale. The columns of memory cells can be arranged in subsets such as sub-blocks.

Further, the NAND strings are arranged in sets, where each NAND string in a set has an SGD transistor with a common control gate voltage. See also FIG. 2B. Regions 201, 203, 205, 207, 208 and 210 each represent a set of NAND strings, or a set of memory cells in a word line layer. For example, region 210 includes NAND strings NS0, . . . , NS0-14. A programming operation can involve one set of NAND strings. Each NAND string in a set can be associated with a respective bit line which is independently controlled to allow or inhibit programming.

The drawings are not to scale and do not show all memory columns. For example, a more realistic block might have twelve memory columns in the y direction as shown, but a very large number such as 32 k memory columns in the x direction, for a total of 384,000 memory columns in a block. With U-shaped NAND strings, 192 k NAND strings are provided in this example. With straight NAND strings, 384,000 NAND strings are provided in this example. Assuming there are twenty-four memory cells per column, there are 384,000× 24=9,216,000 memory cells in the set.

FIG. 2B depicts a top view of example select gate layer portions, consistent with FIG. 2A. In one approach, the select gate layer 215 is different than a WLL in that a separate SGD layer portion or line, is provided for each set of NAND strings. That is, each single row of SGD transistors extending in the x direction is separately controlled. In other words, the control gates of the SGD transistors in each set of NAND strings are commonly controlled.

Further, an SGS layer portion or line is provided for a pair of rows of SGS transistors extending in the x direction, in one approach, for adjacent sets of NAND strings. Optionally, additional slits are used so that a separate SGS layer portion is provided for a single row of SGS transistors extending in the x direction. Thus, the control gates of the SGS transistors in a pair of rows of SGS transistors, or in a single row of SGS transistors, are also commonly controlled.

The SGS and SGD layer portions are created due to slits 239, 240, 241, 242, 243, 245, 247 and 248. The slits extend partway down in the stack as depicted by example slit 241 in FIG. 2C. Regions 227, 228, 229, 232, 233 and 237 represent SGD transistors in SGD layer portions 216, 218, 219, 223, 224 and 226, respectively. Regions 253 and 254, 255 and 257, and 258 and 259 represent SGS transistors in SGS layer portions 217, 221 and 225, respectively. Regions 255 and 257, 258 and 259, represent SGS transistors in SGS layer portions 221 and 225, respectively. The portion 209 from FIG. 2A is repeated for reference.

The select gate transistors are associated with NAND strings NS0-NS5.

FIG. 2C depicts an embodiment of a stack 231 showing a cross-sectional view of the portion 209 of FIG. 2A, along line 220, where three select gate layers, SGL1, SGL2 and SGL3 are provided. In this case, the slit extends down to DL22, so that three separate layers of select gate transistors are provided for each column of each NAND string. The stack has a top 287 and a bottom 238.

The conductive layers of the select gates can have a same height (channel length) as the conductive layers of the memory cells, in one approach. This facilitates the fabrication of the memory device. In a column, the individual select gate transistors together are equivalent to one select gate transistor having a channel length which is the sum of the channel lengths of the individual select gate transistors. Further, in one approach, select gate transistors in a column (e.g., in layers SGL1, SGL2 and SGL3) are connected and received a common voltage during operations. The SGS transistors can have a similar construction as the SGD transistors. Further, the SGS and SGD transistors can have a similar construction as the memory cell transistors.

The substrate may be p-type and can provide a ground which is connected to the top select gate layer, in one approach. A via 244 connects a drain side of C0 and NS0 to a bit line 288. A via 262 connects a source side of C1 and NS0 to a source line 289. Back gates 263, 264, 265 and 266 are provided in NS0, NS1, NS2 and NS3, respectively.

DE denotes a drain end of NS0 and SE denotes a source end of NS0.

Figure 2D:
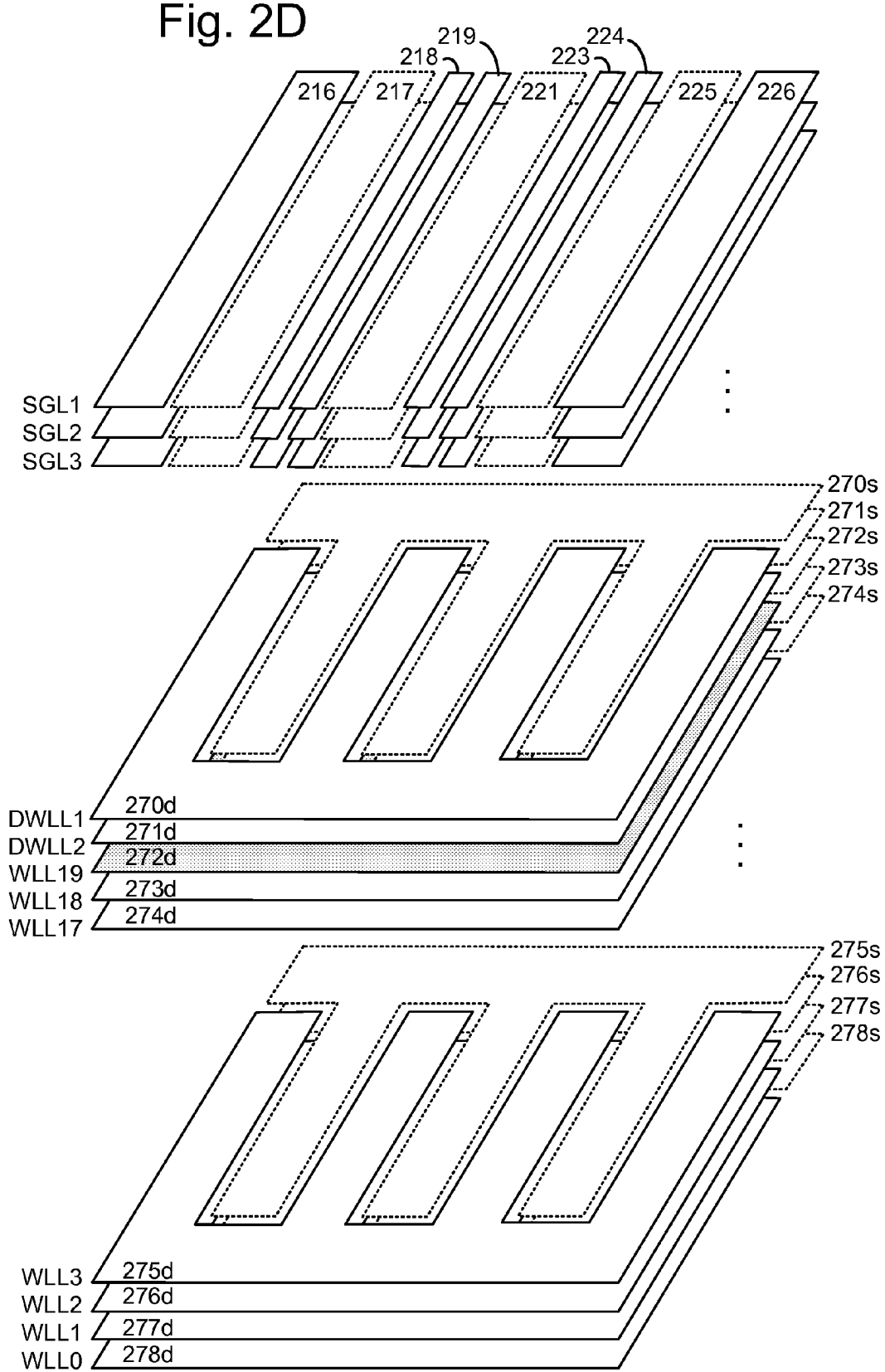
FIG. 2D depicts an alternative view of the select gate layers and word line layers of the stack 231 of FIG. 2C.

FIG. 2D depicts an alternative view of the select gate layers and word line layers of the stack 231 of FIG. 2C. The SGL layers SGL1, SGL2 and SGL3 each includes parallel rows of select gate lines associated with the drain-side (shown by solid lines) or source-side (shown by dotted lines) of a set of NAND strings. For example, SGL1 includes drain-side select gate lines 216, 218, 219, 223, 224 and 226 and source-side select gate lines 217, 221 and 225, consistent with FIG. 2B. Each select gate line can be independently controlled, in one approach.

Below, the SGL layers are the word line layers. Each word line layer includes a drain-side word line connected to memory cells on a drain-side of a NAND string (the half of a NAND string between the back gate and the drain end) and a source-side word line connected to memory cells on a source-side of a NAND string (the half of a NAND string between the back gate and the source end). For example, DWLL1, DWLL2, WLL19, WLL18 and WLL17 include drain-side word lines 270d, 271d, 272d, 273d and 274d, respectively, and source-side word lines 270s, 271s, 272s, 273s and 274s, respectively. Word line 272d, shown shaded, is the drain-side edge word line in a set of word lines. The drain-side edge word line is the word line in a set of word lines which is connected to data-storing memory cells and is closest to the drain side of a set of NAND strings. Word line 272s is the source-side edge word line in the set of word lines. The source-side edge word line is the word line in a set of word lines which is connected to data-storing memory cells and is closest to the source side of a set of NAND strings.

WLL3, WLL2, WLL1 and WLL0 include drain-side word lines 275d, 276d, 277d and 278d, respectively, and source-side word lines 275s, 276s, 277s and 278s, respectively. Each word line can be controlled independently, in one approach.

Figure 3A:
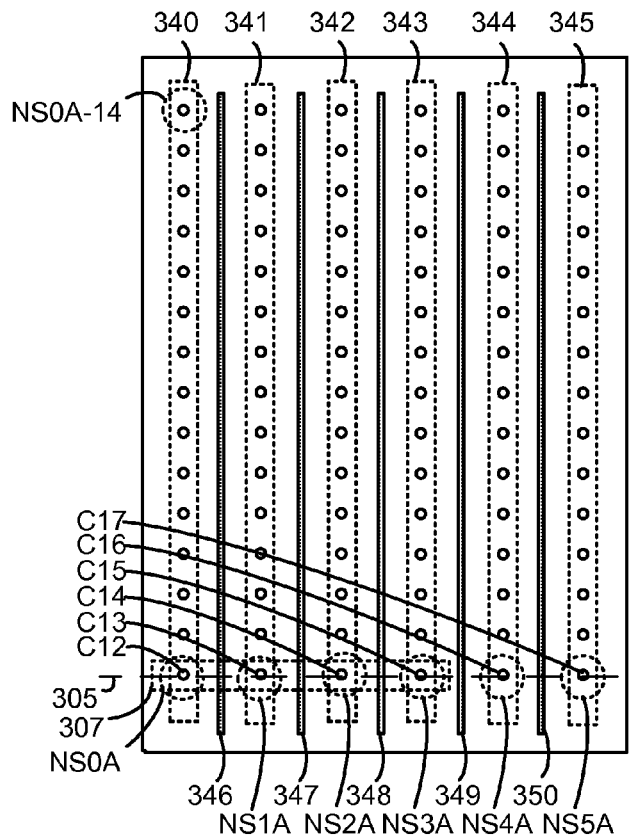
FIG. 3A depicts a top view of an example word line 394 of the block BLK0 of FIG. 1A, in a straight NAND string embodiment.

FIG. 3A depicts a top view of an example word line 394 of the block BLK0 of FIG. 1A, in a straight NAND string embodiment. In this configuration, a NAND string has only one column, and the source-side select gate is on the bottom of the column instead of on the top, as in a U-shaped NAND string. Moreover, a given level of a block has one WLL which is connected to each of the memory cells of the layer. Insulation-filled slits 346, 347, 348, 349 and 350 can also be used in the fabrication process to provide structural support for the stack when undoped polysilicon layers are removed by a wet etch and a dielectric is deposited to form the alternating dielectric layers. A dashed line 305 extends through columns C12-C17. A cross-sectional view along line 305 of portion 307 is shown in FIG. 3C.

Regions 340, 341, 342, 343, 344 and 345 represent the memory cells (as circles) of respective sets of NAND strings. For example, region 340 represents memory cells in NAND strings NS0A, . . . , NS0A-14. Additional NAND strings include NS1A, NS2A, NS3A, NS4A and NS5A.

Alternatively, the layer 394 represents an SGS layer, in which case each circle represents an SGS transistor.

Figure 3B:
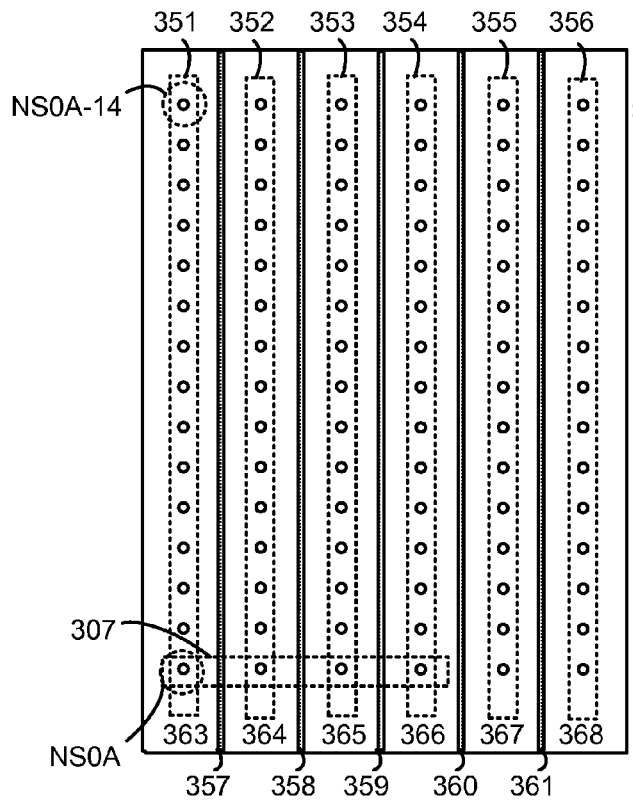
FIG. 3B depicts a top view of an example SGD layer SGD1, consistent with FIG. 3A.
Figure 3C:
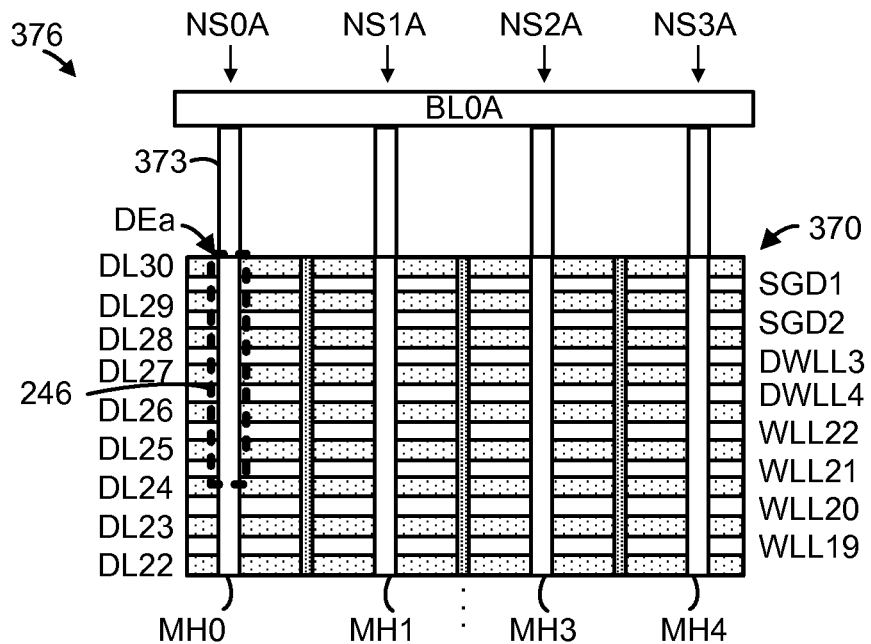
FIG. 3C depicts an embodiment of a stack 376 showing a cross-sectional view of the portion 307 of FIG. 3A, along line 305.
Figure 3C:
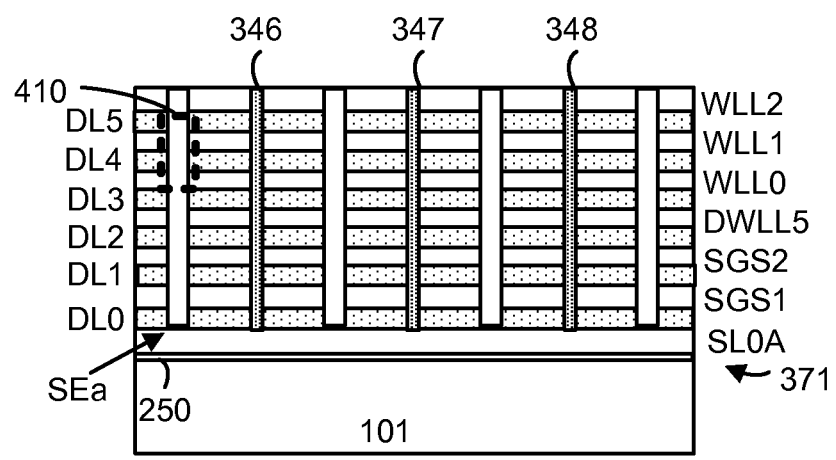

FIG. 3B depicts a top view of an example SGD layer, SGD1, consistent with FIG. 3A. Slits 357, 358, 359, 360 and 361 divide the SGD layer into portions 363, 364, 365, 366, 367 and 368. Each portion connects the SGD transistors in a set of NAND strings. For example, SGD layer portion 363 or line connects the SGD transistors in the set of NAND strings NS0A to NS0A-14. Regions 351, 352, 353, 354, 355 and 356 represent the SGD transistors (as circles) of respective sets of NAND strings in the SGD layer portions 363, 364, 365, 366, 367 and 368, respectively. The portion 307 from FIG. 3A is also repeated. The select gate transistors are associated with NAND strings NS0A-NS5A.

FIG. 3C depicts an embodiment of a stack 376 showing a cross-sectional view of the portion 307 of FIG. 3A, along line 305. The stack includes SGD layers SGD1 and SGD2, drain-side dummy word line layers DWLL3 and DWLL4, data word line layers WLL0 to WLL22, a source-side dummy word line layer DWLL5 and SGS layers SGS1 and SGS2. Columns of memory cells corresponding to NAND strings NS0A-NS3A are depicted in the multi-layer stack. The stack includes a substrate 101, an insulating film 250 on the substrate, and a portion of a source line SL0A. Additional straight NAND strings in a SGD line subset extend behind the NAND strings depicted in the cross-section, e.g., along the x-axis. NS0A has a source end SEa and a drain end DEa. The slits 346, 347 and 348 from FIG. 3A are also depicted. A portion of the bit line BL0A is also depicted. A conductive via 373 connects DEa to BL0A. The columns are formed in memory holes MH0-MH4. The memory holes are columnar and extend at least from a top 370 to a bottom 371 of the stack.

The source line SL0A is connected to the source ends of each NAND string. SL0A is also connected to other sets of memory strings which are behind these NAND strings in the x direction.

Word line layers, e.g., WLL0-WLL22, and dielectric layers, e.g., DL0-DL30, are arranged alternatingly in the stack. SGS transistors are formed in the SGS1 and SGS2 layers.

Figure 4A:
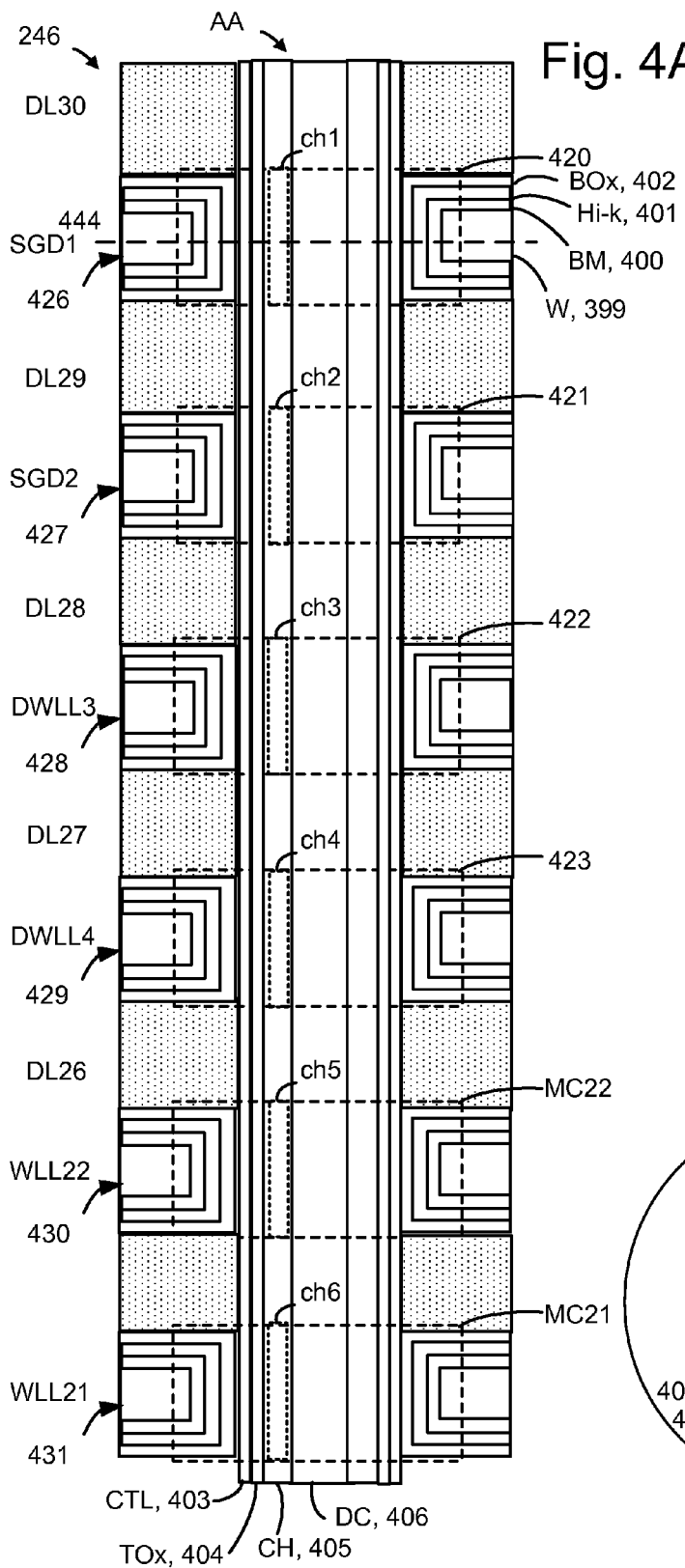
FIG. 4A depicts a view of the region 246 of FIG. 3C, showing SGD transistors 420 and 421, dummy memory cells 422 and 423, and data-storing memory cells MC21 and MC22.

A region 246 of the stack is shown in greater detail in FIG. 4A.

Figure 4B:
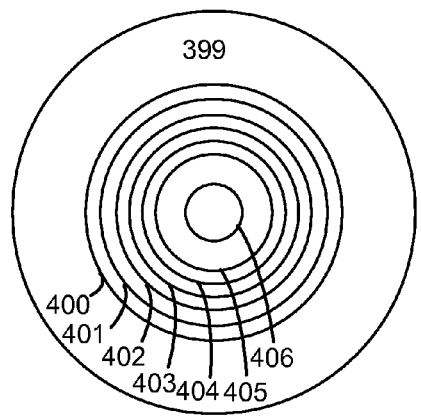
FIG. 4B depicts a cross-sectional view of the region 246 of FIG. 3C along line 444.
Figure 4C:
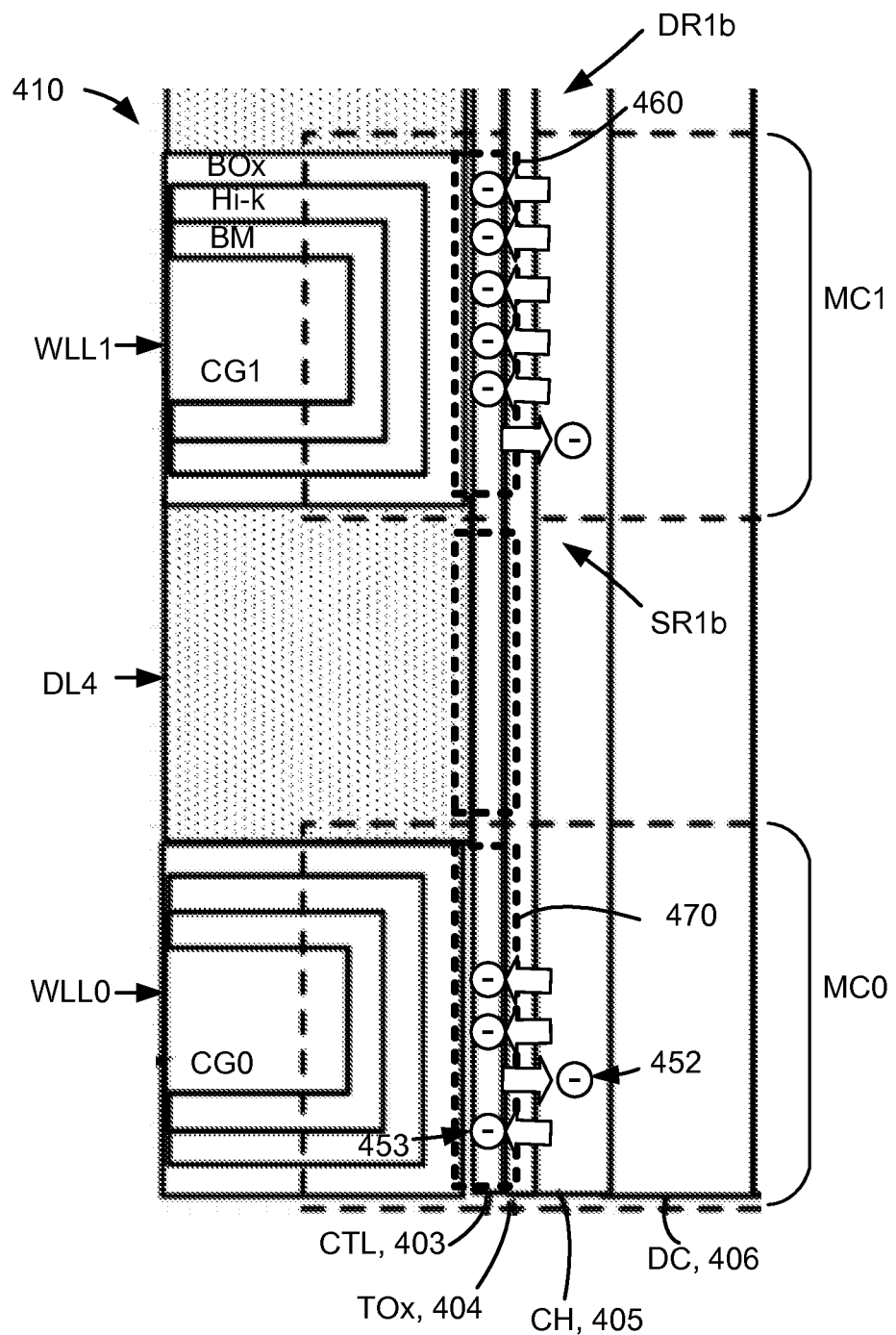
FIG. 4C depicts a view of the region 410 of FIG. 3C, showing memory cells MC0 and MC1.

A region 410 of the stack is shown in greater detail in FIG. 4C.

Figure 3D:
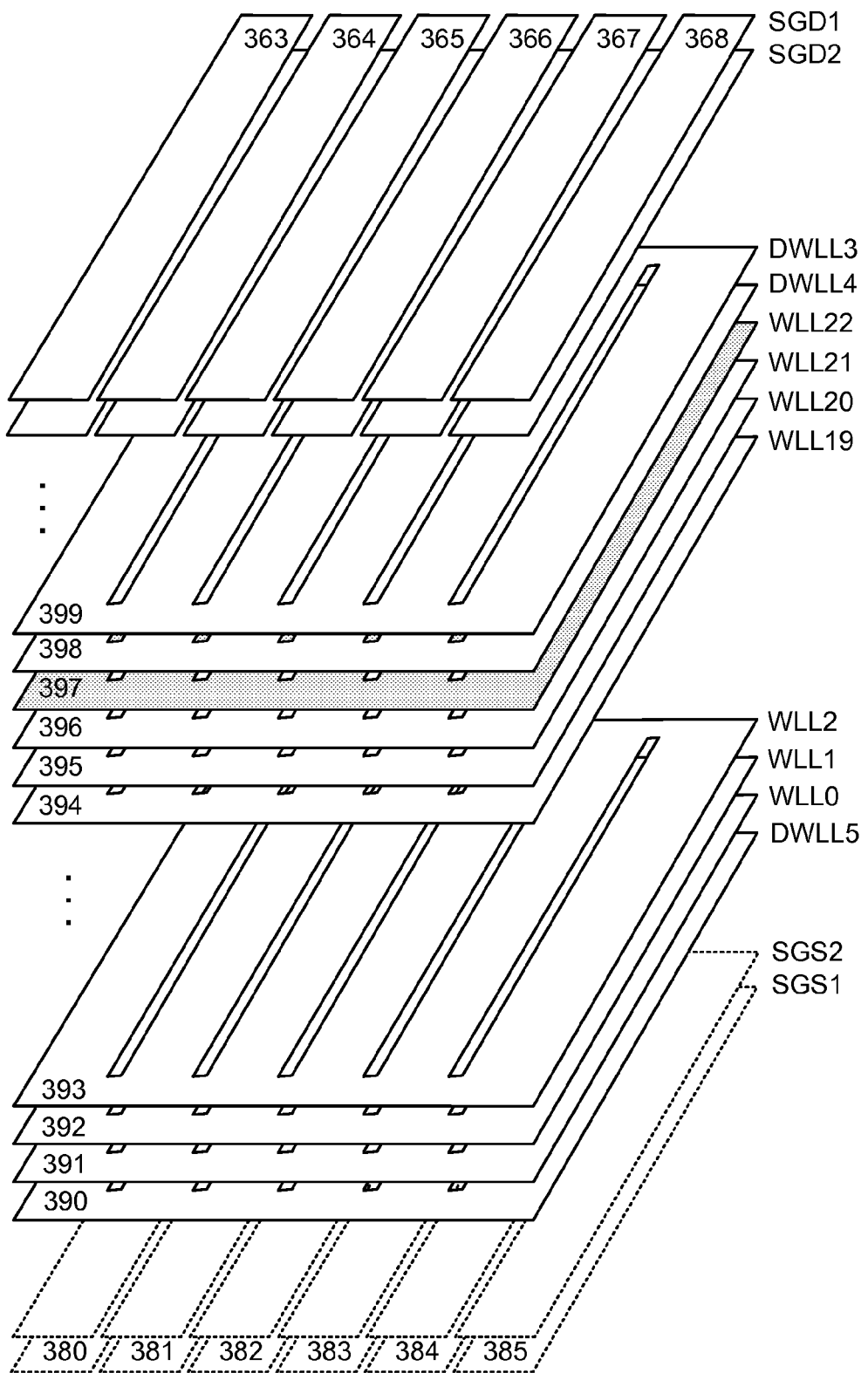
FIG. 3D depicts an alternative view of the select gate layers and word line layers of the stack 376 of FIG. 3C.

FIG. 3D depicts an alternative view of the select gate layers and word line layers of the stack 376 of FIG. 3C. The SGD layers SGD1 and SGD2 each includes parallel rows of select gate lines associated with the drain-side of a set of NAND strings. For example, SGD1 includes drain-side select gate lines 363, 364, 365, 366, 367 and 368, consistent with FIG. 3B. Each select gate line can be independently controlled, in one approach.

Below the SGD layers are the word line layers. Each word line layer represents a word line, in one approach, and is connected to a set of memory cells at a given height in the stack. For example, DWLL3, DWLL4, WLL22, WLL21, WLL20 and WLL19 represent word lines 399, 398, 397, 396, 395 and 394, respectively. Word line 397, shown shaded, is the drain-side edge word line for the NAND strings. WLL2, WLL1, WLL0 and DWLL5 represent word lines 393, 392, 391 and 390, respectively. Each word line can be controlled independently, in one approach.

Below the word line layers are the SGS layers. The SGS layers SGS1 and SGS2 each includes parallel rows of select gate lines associated with the source-side of a set of NAND strings. For example, SGS1 includes source-side select gate lines 380, 381, 382, 383, 384 and 385. Each select gate line can be independently controlled, in one approach.

FIG. 4A depicts a view of the region 246 of FIG. 3C, showing SGD transistors 420 and 421, dummy memory cells 422 and 423, and data-storing memory cells MC21 and MC22. A number of layers can be deposited along the sidewalls of the column and within each word line layer. These layers can include oxide-nitride-oxide (O—N—O) and polysilicon layers which are deposited, e.g., using atomic layer deposition. For example, the column includes a charge-trapping layer or film (CTL) 403 such as SiN or other nitride, a tunnel oxide (TOx) 404, a polysilicon body or channel (CH) 405, and a dielectric core (DC) 406. A word line layer includes a block oxide (BOx) 402, a block high-k material 401, a barrier metal 400, and a conductive metal such as W 399 as a control gate. For example, control gates 426 and 427 are provided for the SGD transistors 420 and 421, respectively, control gates 428 and 429 are provided for the dummy memory cells 422 and 423, respectively, and control gates 430 and 431 are provided for the data memory cells MC22 and MC21, respectively.

In another approach, all of these layers except the metal are provided in the column. Additional memory cells and SGS transistors are similarly formed in the columns. The layers in the memory hole form a columnar active area (AA) of the NAND string.

The use of one or more dummy memory cells between the select gate transistors and the data-storing memory cells is useful since program disturb can be greater for memory cells adjacent to, or close to, the select gate transistors. These edge cells have a lower amount of channel boosting due to constraints on the voltages of the select gate transistors, as seen in FIG. 7B. For example, the channel 405 includes channel regions ch1 and ch2 associated with SGD transistors 420 and 421, respectively, channel regions ch3 and ch4 associated with dummy memory cells 422 and 423, respectively, and channel regions ch5 and ch6 associated with data-storing memory cells MC22 and MC21, respectively. Each channel region may be annular.

In particular, to provide the select gate transistors in a non-conductive state, a relatively low voltage is applied to their control gates, resulting in a relatively lower amount of channel boosting in a region of the channel next to these select gate transistors. A region of the channel next to an edge cell will therefore also have a relatively lower amount of channel boosting. In contrast, the cells next to a non-edge cell can receive a relatively high pass voltage since these cells are provided in a conductive state, resulting in a relatively higher amount of channel boosting.

When a memory cell is programmed, electrons are stored in a portion of the CTL which is associated with the memory cell. These electrons are drawn into the CTL from the channel, and through the TOx. The Vth of a memory cell is increased in proportion to the amount of stored charge. During an erase operation, the electrons return to the channel.

Each of the memory holes can be filled with a plurality of annular layers comprising a block oxide layer, a charge trapping layer, a tunneling layer and a channel layer. A core region of each of the memory holes is filled with a body material, and the plurality of annular layers are between the core region and the WLLs in each of the memory holes.

FIG. 4B depicts a cross-sectional view of the region 246 of FIG. 4A along line 444. Each layer is ring-shaped in one possible approach, except the core filler, which is a cylinder.

FIG. 4C depicts an expanded view of a region 410 of the NAND string of FIG. 3C2. When a program voltage is applied to the control gate of a memory cell via a respective word line, an electric field is generated. In a memory cell MC0, the electric field causes electrons to tunnel into a region 470 of the charge-trapping layer 403, from the channel 405. Similarly, for a memory cell MC1, the electric field causes electrons to tunnel into a region 460 of the charge-trapping layer 403, from the channel 405. The movement of the electrons into the charge-trapping layer is represented by the arrows which point to the left. The electrons are represented by circles with a dash inside the circle.

When a memory cell on a selected word line is subsequently read back, control gate read voltages such as VreadA, VreadB and VreadC are applied to the memory cell while sensing circuitry determines whether the memory cell is in a conductive state. At the same time, a read pass voltage, Vread (e.g., 8-9 V), is applied to the remaining word lines.

However, as mentioned at the outset, the accuracy of the read back operation can be impaired by charge loss in the memory cells. Charge loss is represented by the arrows which point to the right. For example, an electron 452 is an example of a charge which has de-trapped from the charge-trapping region 470, lowering the Vth of MC0. An electron 453 is an example of a charge which remains in the charge-trapping region 470.

MC1 has a drain DR1b, a source SR1b and a control gate CG1.

Figure 5A:
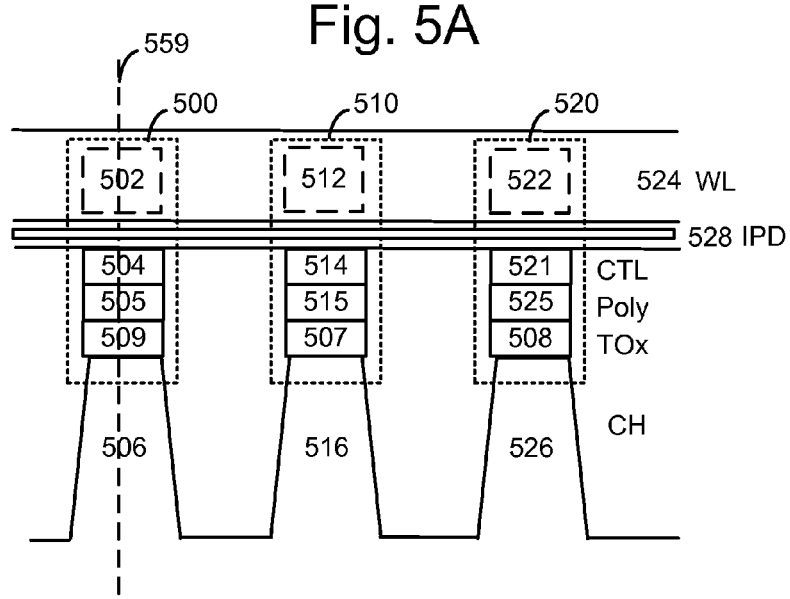
FIG. 5A depicts a cross-sectional view in a word line direction of memory cells comprising a flat control gate and charge-trapping regions as a 2D example of memory cells in the memory structure 126 of FIG. 1B.

FIG. 5A depicts a cross-sectional view in a word line direction of memory cells comprising a flat control gate and charge-trapping regions a 2D example of memory cells in the memory structure 126 of FIG. 1B. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 524 extends across NAND strings which include respective channel regions 506, 516 and 526. Portions of the word line provide control gates 502, 512 and 522. Below the word line is an inter-poly dielectric (IPD) layer 528, charge-trapping layers 504, 514 and 521, polysilicon layers 505, 515 and 525 and tunnel oxide (TOx) layers 509, 507 and 508. Each charge-trapping layer extends continuously in a respective NAND string.

A memory cell 500 includes the control gate 502, the charge-trapping layer 504, the polysilicon layer 505 and a portion of the channel region 506. A memory cell 510 includes the control gate 512, the charge-trapping layer 514, a polysilicon layer 515 and a portion of the channel region 516. A memory cell 520 includes the control gate 522, the charge-trapping layer 521, the polysilicon layer 525 and a portion of the channel region 526.

Further, a flat control gate may be used instead of a control gate that wraps around a floating gate. One advantage is that the charge-trapping layer can be made thinner than a floating gate. Additionally, the memory cells can be placed closer together.

Figure 5B:
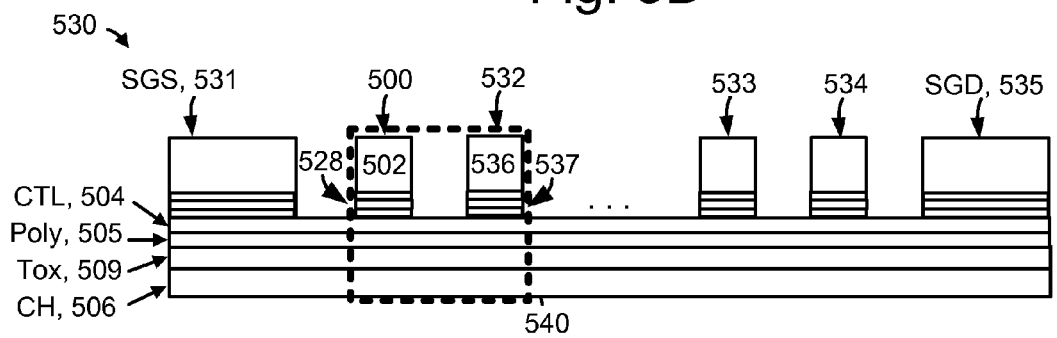
FIG. 5B depicts a cross sectional view along line 559 in FIG. 5A, showing a NAND string 530 having a flat control gate and a charge-trapping layer.

FIG. 5B depicts a cross sectional view along line 559 in FIG. 5A, showing a NAND string 530 having a flat control gate and a charge-trapping layer. The NAND string 530 includes an SGS transistor 531, example storage elements 500, 532, . . . , 533 and 534, and an SGD transistor 535. The SGD transistor can be biased to produce GIDL during an erase operation, as discussed. The memory cell 500 includes the control gate 502 and an IPD portion 528 above the charge-trapping layer 504, the polysilicon layer 505, the tunnel oxide layer 509 and the channel region 506. The memory cell 532 includes a control gate 536 and an IPD portion 537 above the charge-trapping layer 504, the polysilicon layer 505, the tunnel oxide layer 509 and the channel region 506.

The control gate layer may be polysilicon and the tunnel oxide layer may be silicon oxide, for instance. The IPD layer can be a stack of high-k dielectrics such as AlOx or HfOx which help increase the coupling ratio between the control gate layer and the charge-trapping or charge storing layer. The charge-trap layer can be a mix of silicon nitride and oxide, for instance. A difference between a floating gate memory cell and the flat memory cell is the height of the charge storage layer. A typically floating gate height may be about 100 nm, while a charge-trap layer can be as small as 3 nm, and the polysilicon layer can be about 5 nm. The SGD and SGS transistors have the same configuration as the storage elements but with a longer channel length to ensure that current is cutoff in an inhibited NAND string.

Figure 5C:
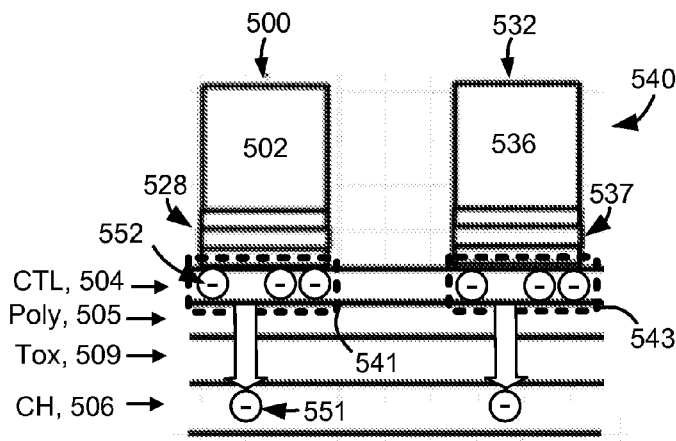
FIG. 5C depicts an expanded view of a portion 540 of the NAND string of FIG. 5B.

FIG. 5C depicts an expanded view of a portion 540 of the NAND string of FIG. 5B. The charge-trapping layer 504 includes regions 541 and 543 which are directly under and adjacent to the memory cells 500 and 532, respectively.

Charge loss can occur in a 2D memory device in a similar way as in the 3D memory device. Charge loss is represented by the arrows which point downward. For example, an electron 551 is an example of a charge which has de-trapped from the charge-trapping region 541, lowering the Vth of the memory cell 500. An electron 552 is an example of a charge which remains in the charge-trapping region 541.

Figure 6A:
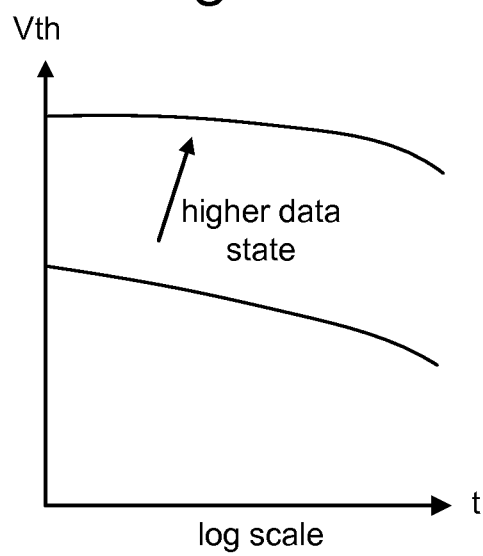
FIG. 6A is a plot of Vth versus time, showing a decrease in Vth after a memory cell is programmed due to short-term charge loss.

FIG. 6A is a plot of Vth versus time, showing a decrease in Vth after a memory cell is programmed due to short-term charge loss. The horizontal axis depicts time on a logarithmic scale and the vertical axis depicts the Vth of a memory cell. After the memory cell is programmed to its target data state, its Vth gradually decreases. The rate of decrease may be a function of the data state, such that the rate is smaller when the Vth of the data state is higher. This is because the memory cells with the higher data states receive a larger number of program pulses before they complete programming, compared to memory cells with the lower data states. The additional program pulses accelerate hole redistribution in the charge-trapping material before the memory cells with the higher data states have completed programming. Further, relatively high magnitude program pulses are used which stress the gate stacks of the memory cells with the higher data states, also accelerating hole redistribution.

Figure 6B:
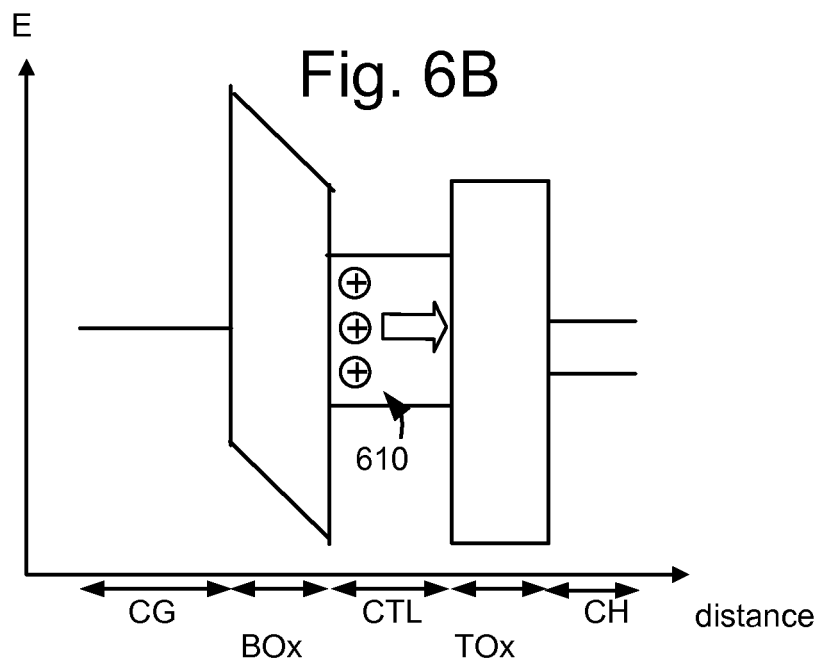
FIG. 6B depicts an energy band diagram for a charge-trapping memory cell.

FIG. 6B depicts an energy band diagram for a memory cell. The horizontal axis depicts a distance in the memory cell. For example, this can be a lateral distance in a 3D memory device or a vertical distance in a 2D memory device. The vertical axis depicts an energy level. The memory cell includes a channel region (CH), a tunnel oxide region (TOx), a charge-trapping layer (CTL), a block oxide (BOx) and a control gate (CG). Example holes 610 in the CTL are also depicted. This is a band diagram at a flatband condition after erase, and represents how the holes are redistributed in the CTL due to the use of a positive control gate voltage after erase, as described herein. By programming the edge word line first, a significant amount of redistribution occurs before programming the non-edge word lines. As a result, the redistribution and accompanying charge loss which occurs after programming of the non-edge word lines is reduced.

FIG. 7A depicts a circuit diagram of a NAND string consistent with the memory devices of FIGS. 2C and 3C. An example NAND string NS0A, consistent with FIG. 3C (or NS0 consistent with FIG. 2C), includes SGD transistors 702 and 703, drain-side dummy memory cells 704 and 705, a drain-side memory cell 706, other memory cells 707, . . . , 708, 709, a source-side dummy memory cell 710, and SGS transistors 711 and 712. A bit line BL0A connects the drain end of the NAND string to sensing circuitry 700, which is used to sense the NAND string during operations involving the select gate transistors and the memory cells. A source line 713 is connected to a source end of the NAND string. Voltage drivers can be used to provide the voltages depicted. For example, Vsgd is applied to the control gates of the SGD transistors, which are connected to one another, and Vsgs is applied to the control gates of the SGS transistors, which are connected to one another. Vdwll3, Vdwll4 and Vdwll5 are applied to the dummy memory cells 704, 705 and 710, respectively. During programming of the drain-side word line WLL22, a program voltage Vpgm is applied to the drain-side word line WLL22 and a pass voltage, Vpass, is applied to the other word lines WLL0-WLL21. Vbl is the bit line voltage and Vsl is the source line voltage.

FIG. 7B depicts channel boosting along a height of the NAND string of FIG. 7A. The horizontal axis depicts a channel boosting level (Vch) and the vertical axis depicts a position along the NAND string NS0A of FIG. 7A. As mentioned, the memory cell at the edge of an unselected NAND string has a lower amount of channel boosting due to constraints on the voltages of the select gate transistors. As a result, program disturb is relatively high for the memory cell at the edge of the NAND string, or, more generally, for a set of memory cells connected to a corresponding edge word line, compared to memory cells on other word lines. The increase in program disturb is highest for the drain-side edge word line, although some increase can occur as well on the source-side edge word line, compared to non-edge word lines.

As an example, for an inhibited NAND string, assume Vbl=2 V. Additionally, for all NAND strings, Vsgd=2 V, Vdwll3=4, Vdwll4=6 V, Vpgm=12-22 V, Vpass=8 V and Vsl=2 V. Vch is at a relatively low level which is comparable to Vbl, adjacent to the SGD1 and SGD2 select gate transistors 702 and 703, respectively. Adjacent to the dummy memory cell 704, Vch is approximately equal to Vdwll3 minus the Vth of the dummy memory cell 704. Adjacent to the dummy memory cell 705, Vch is approximately equal to Vdwll4 minus the Vth of the dummy memory cell 705. Adjacent to the edge memory cell 706, Vch is 1-2 V below a peak level, Vch_peak. Vch is at the peak level (e.g., 9-11 V) adjacent to the other memory cells 707-709. Note that Vpgm and Vpass boost the channel voltage due to capacitive coupling.

The control gate voltage can be set to increase gradually on the dummy memory cells based on their distance from the bit line to create a gradual change in Vch to reduce the amount of electron-hole generation. However, for the drain-side edge word line, there is still a relatively high gradient in Vch which results in a relatively high amount of electron-hole generation. The holes tend to travel past the select gate and up to the bit line while the electrons travel in the channel underneath the programmed cell and pull down the boosting potential.

Figure 8A:
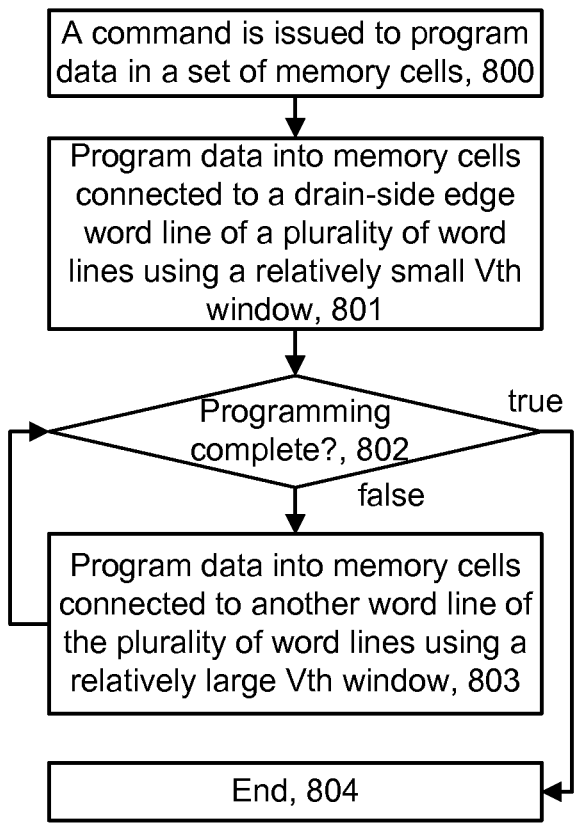
FIG. 8A depicts an example programming operation in which a drain-side edge word line is treated differently than other word lines.

FIG. 8A depicts an example programming operation in which a drain-side edge word line is treated differently than other word lines. At step 800, a command is issued to program data in a set of memory cells. For example, a controller may provide such a command. Prior to the command to program data, the memory cells connected to the drain-side word line and the memory cells connected to the another word line are erased using a common erase verify voltage (Vv_erase). Step 801 includes programming data into memory cells connected to a drain-edge word line of a plurality of word lines using a relatively small Vth window. For example, see window1 in FIGS. 10B and 10C and window1a in FIG. 11A. The Vth window refers to a range of threshold voltages of the programmed data states, in one possible definition. A decision step 802 determines if programming is complete. This is true when all data which is to be programmed has been programmed. If decision step 802 is true, the programming operation ends at step 804. If decision step 802 is false, the programming operation continues at step 803. Step 803 includes programming data into memory cells connected to another word line of the plurality of word lines using a relatively large Vth window. For example, see window2 in FIG. 10A and window2a in FIG. 11B. Decision step 802 is then repeated.

As mentioned, program disturb is typically worst for the memory cells on the drain-side edge word line, so that these cells are programmed differently than the memory cells on other word lines. However, the process of FIG. 8A can be modified to account for an increased level of program disturb on other word lines such as the second drain-side edge word line, i.e., WLL21 in FIG. 7A. For example, the memory cells of WLL21 can be programmed to a Vth window which is wider than for the drain-side edge word line and narrower than for the other word lines. The A state verify level can therefore be lower than the drain-side edge word line but higher than for other word lines. The process of FIG. 8A can also be modified to account for an increased level of program disturb on a source-side word line, i.e., WLL0 in FIG. 7A. For example, these memory cells can be programmed to a Vth window which is equal to or wider than for the drain-side edge word line but narrower than for the other word lines. The A state verify level can therefore be equal to or lower than for the drain-side edge word line and higher than for other word lines.

FIG. 8B depicts an example of step 801 of FIG. 8A for programming data into memory cells connected to a drain-side edge word line. Step 810 includes setting the program voltage (Vpgm) to an initial value, Vpgm_init1 (see FIG. 9A) and setting a step size, dVpgm1, to be relatively small. That is, one or both of these values are smaller than for the case of programming a non-edge word line as in the process of FIG. 8C. It is also possible to set a shorter pulse width for the programming of the drain-side edge word line than for the programming of other word lines. Or, a pulse width of a first set of step-wise increasing program voltages of FIG. 8B can be equal to a pulse width of a second set of step-wise increasing program voltages of FIG. 8C. The use of an equal pulse width provides a less complex implementation.

Step 811 includes setting a program loop counter (PL)=1 to indicate that this is the first program loop. Step 812 includes applying Vpgm to the drain-side edge word line. Step 812a provides an option for a slow programming mode using an elevated bit line voltage (Vbl). See also FIG. 10C. The slow programming mode is not typically used in the first program loop. A decision step 813 determines if PL is less than or equal to a predetermined number, Nskip_verify, which is a number of initial program loops in the programming operation which are not followed by a verify test. This option reduces the programming time by allowing verify tests to be skipped when it is unlikely that any of the memory cells with the lowest target data state (e.g., A state) will have reached the associated verify level, VvAe (FIG. 10B or 11A) or VvAeL (FIG. 10C).

If decision step 813 is true, step 814 indicates that verify tests for the memory cells of the drain-side edge word line are skipped. That is, the program loop applies a program voltage but without performing a verify test using any verify voltage of a first set of verify voltages. If decision step 813 is false, step 815 is reached. This step involves performing a verify test for one or more target data states based on PL using a first set of verify voltages. For example, when PL is relatively low, the verify tests can be for the lower target data states. When PL has mid-range value, the verify tests can be for mid-range target data states. When PL is relatively high, the verify tests can be for the higher target data states.

Figure 9A:
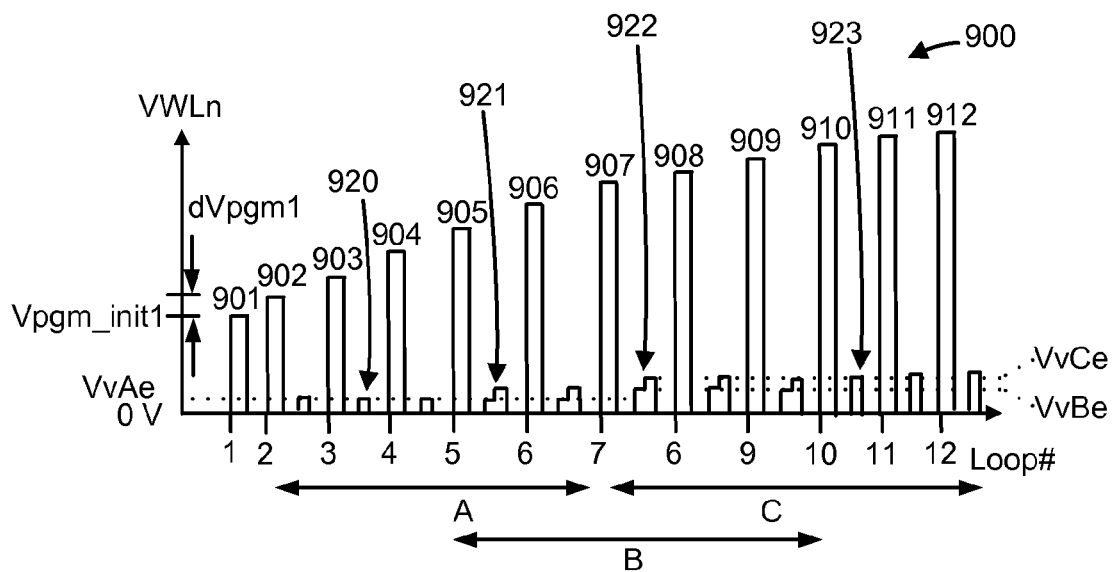
FIG. 9A depicts voltages applied to a drain-side edge word line in a programming operation, consistent with FIG. 8B.

An example of performing verify tests for one or more target data states based on PL is provided in FIG. 9A. Examples of the first set of verify voltages are provided in FIG. 10B (VvAe, VvBe, VvCe), FIG. 10C (VvAeL, VvBeL, VvCeL; VvAe, VvBe, VvCe) and FIG. 11A (VvAe, VvBe, VvCe, VvDe, VvEe, VvFe, VvGe). The verify voltages can be set specifically for the drain-side edge word line so that the associated memory cells have a relatively small Vth window. For example, the lowest verify voltage (e.g., VvAe) of the first set of verify voltages (for the drain-side edge word line) can be higher than a lowest verify voltage (e.g., VvA) of a second set of verify voltages (for other word lines).

In a verify test, a verify voltage associated with a target data state is applied to the word line while sensing circuitry determines whether the memory cell is in a conductive state. At the same time, a read pass voltage, Vread (e.g., 8-9 V), is applied to the remaining word lines. If a memory cell is in a non-conductive state, its Vth exceeds the verify voltage and it passes the verify test. If a memory cell is in a conductive state, its Vth does not exceed the verify voltage and it fails the verify test. In some cases, a verify test which is performed for a memory cell is not relevant because the memory cell has a different target data state than the target data state which is tested by the verify test. Sensing results in these cases can be discarded.

Step 815*a* provides an option for a slow programming mode using an elevated bit line voltage (Vbl). For example, verify tests can be performed using final verify voltages which define a minimum Vth of a target data state and verify voltages which are offset from these final verify voltages. For example, in FIG. 10C, the final verify voltages are VvAe, VvBe and VvCe and the offset verify voltages are VvAeL, VvBeL and VvCeL, respectively. When a verify test indicates that a memory cell has a Vth below the offset verify voltage of the target data state of the memory cell, the memory cell is placed in a fast programming mode in the next program loop. In this case, Vbl is kept low such as at 0 V so that programming is not slowed. When a verify test indicates that a memory cell has a Vth between the offset verify voltage and the final verify level of the target data state of the memory cell, the memory cell is placed in a slow programming mode in the next program loop. In this case, Vbl is set at an elevated level such as 1 V so that programming is slowed. This increases the accuracy of the programming so that narrower Vth distributions and a narrower Vth window can be achieved. When a verify test indicates that a memory cell has a Vth above the final verify level of the target data state of the memory cell, the memory cell is placed in an inhibit mode in the remaining program loops of the programming operation. In this case, Vbl is set at an inhibit level such as 2 V so that programming is prevented.

A decision step 816 determines whether programming is completed for the memory cells of the drain-side edge word line. This decision step is true if all or most (e.g., 90-95% or more) of the memory cells have reached their target data state and passed the associated verify test. If decision step 816 is true, the programming of the memory cells of the drain-side edge word line ends at step 819. If decision step 816 is false, step 817 involves incrementing Vpgm by a relatively small step size (e.g., smaller than a step size used for programming other word lines), step 818 increments the program loop counter (PL) and a next program voltage is applied at step 812.

The slow programming mode can occur, e.g., when the set of NAND strings is connected to a set of bit lines, the programming of the memory cells connected to the drain-side word line uses a fast programming mode followed by a slow programming mode for at least one target data state (e.g., A, B and/or C) of the plurality of target data states, the fast programming mode is implemented by a grounded bit line voltage, the slow programming mode is implemented by an elevated bit line voltage, and the programming of the memory cells connected to another word line uses the fast programming mode but not the slow programming mode for the at least one target data state of the plurality of target data states.

Figure 8C:
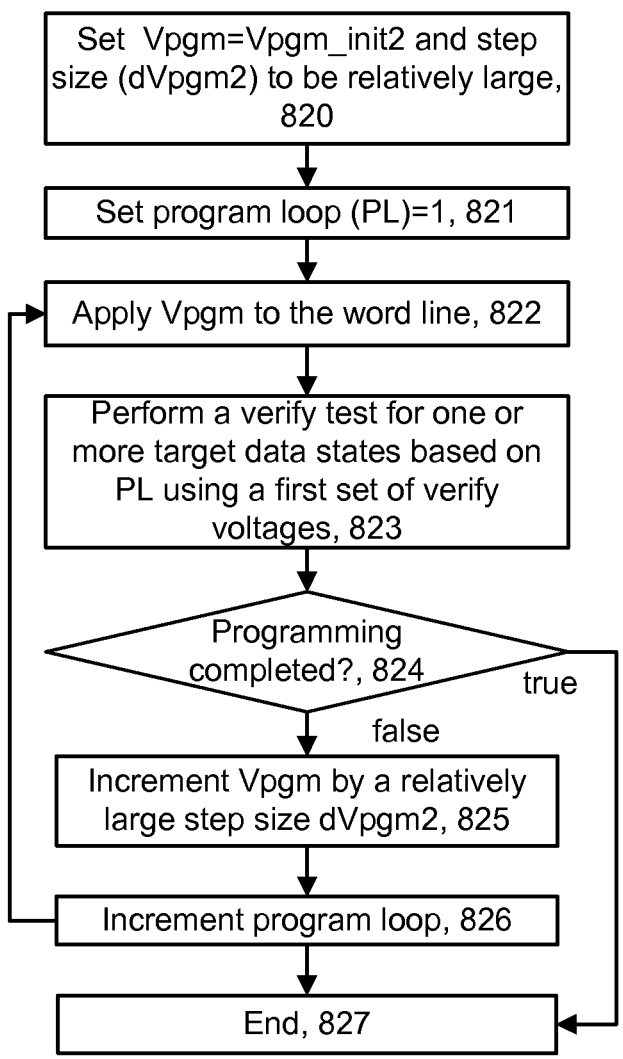
FIG. 8C depicts an example of step 802 of FIG. 8A for programming data into memory cells connected to another word line.

FIG. 8C depicts an example of step 802 of FIG. 8A for programming data into memory cells connected to another word line. In the case of another word line, e.g., a non-drain-side edge word line in a set of word lines, the programming can be adjusted to permit a larger Vth window, as discussed. Step 820 includes setting Vpgm to an initial value, Vpgm_init2 (see FIG. 9B) and setting a step size, dVpgm2, to be relatively large. That is, one or both of these values can be larger than for the case of programming an edge word line. For example, Vpgm_init1 can be about 2 V lower than Vpgm_init2 and dVpgm1 can be about 0.2 V lower than dVpgm2, e.g., 0.4 V vs. 0.6 V. Step 821 includes setting a program loop counter (PL)=1 to indicate that this is the first program loop. Step 822 includes applying Vpgm to the word line.

In one approach, in contrast to FIG. 8B, the slow programming mode is not used since it is permissible to have a larger Vth window. The slow programming mode can increase programming time.

Step 823 involves performing a verify test for one or more target data states based on PL using a second set of verify voltages which differs, at least in part, from the first set of verify voltages. Examples of the second set of verify voltages are provided in FIG. 10A (VvA, VvB and VvC) and FIG. 11B (VvA, VvB, VvC, VvD, VvE, VvF, VvG). The verify voltages can be set specifically for the word lines other than the drain-side edge word line so that the associated memory cells have a relatively large window. For example, the lowest verify voltage (e.g., VvA) of the second set of verify voltages can be lower than a lowest verify voltage (e.g., VvAe) of the first set of verify voltages. In one approach, the highest verify voltage (e.g., VvC or VvG) of the second set of verify voltages is equal to the highest verify voltage (e.g., VvC or VvGe) of the first set of verify voltages. Or, the highest verify voltage of the second set of verify voltages is slightly higher than the highest verify voltage of the first set of verify voltages, but the upper tails of the highest target data states are substantially equal.

In the first set of verify voltages, the verify voltages of the intermediate target data states (e.g., VvB or VvB, VvC, VvD, VvE, VvF) are spaced apart, e.g., by equal spaces, between the verify voltages of the lowest (e.g., VvA) and highest (e.g., VvC or VvG) target data states. Similarly, in the second set of verify voltages, the verify voltages of the intermediate target data states (e.g., VvBe or VvBe, VvCe, VvDe, VvEe, VvFe) are spaced apart, e.g., by equal spaces, between the verify voltages of the lowest (e.g., VvAe) and highest (e.g., VvCe or VvGe) target data states. The spacing can be smaller in the first set of verify voltages than in the second set of verify voltages to provide the smaller Vth window.

In one approach, in contrast to FIG. 8B, a verify skip option is not used in which a number of initial program loops in the programming operation are not followed by a verify test. This option may not be desirable because the Vth of some of the A state memory cells may exceed VvA after just one program pulse, due to the higher initial value of Vpgm in FIG. 8C than in FIG. 8B.

A decision step 824 determines whether programming is completed for the memory cells of the word line. This decision step is true if all or most (e.g., 90-95% or more) of the memory cells have reached their target data state and passed the associated verify test. If decision step 824 is true, the programming of the memory cells of the word line ends at step 827. If decision step 824 is false, step 825 involves incrementing Vpgm by a relatively large step size (e.g., larger than a step size used for programming the drain-side edge word line), step 826 increments the program loop counter (PL) and a next program voltage is applied at step 822.

Figure 9B:
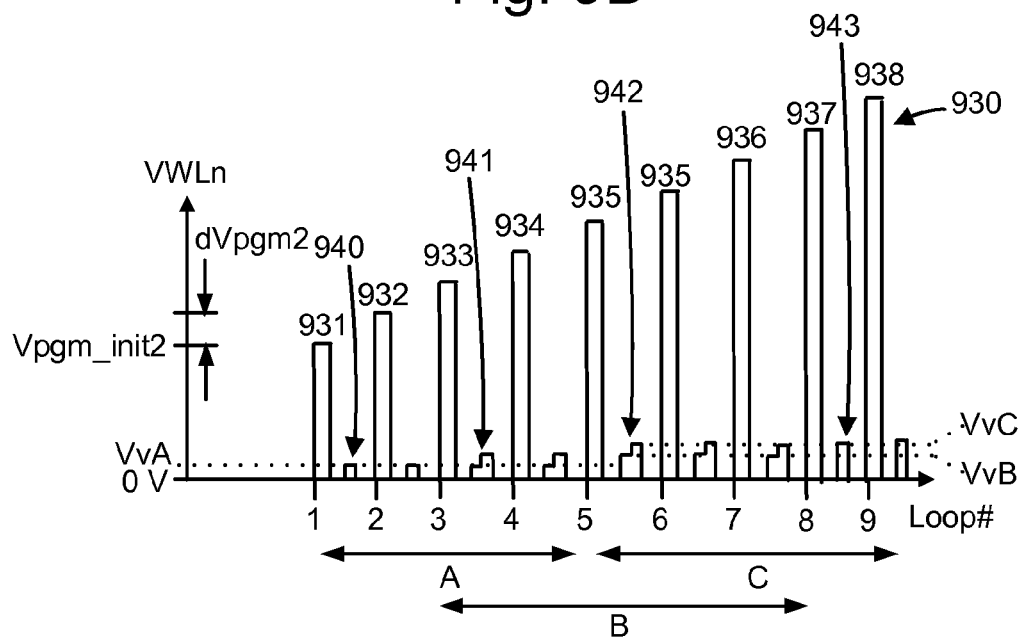
FIG. 9B depicts voltages applied to another word line in a programming operation, consistent with FIG. 8C.

FIG. 9A depicts voltages applied to a drain-side edge word line in a programming operation, consistent with FIG. 8B. In FIGS. 9A and 9B, the horizontal axis depicts time or program loops and the vertical axis depicts VWLn, the voltage on an nth word line which is selected for programming.

The programming pass comprises a waveform 900 which includes program voltages and verify voltages in program loops. Each program loop comprises a program voltage and one or more verify voltages, with the option to skip the verify voltages for one or more initial program loops. In this example, the verify voltages are skipped for one initial program loop. For example, the programming the memory cells connected to the drain-side word line comprises applying a first set of step-wise increasing program voltages (901-912) to the drain-side word line without performing a verify test using any verify voltage of the first set of verify voltages after an initial program voltage (901) of the first set of step-wise increasing program voltages and before a next program voltage (902) of the first set of step-wise increasing program voltages, and the programming the memory cells connected to the another word line comprises applying a second set of step-wise increasing program voltages (931-938) to the another word line and performing a verify test using a lowest verify voltage (VvA) of the second set of verify voltages after an initial program voltage (931) of the second set of step-wise increasing program voltages and before a next program voltage (932) of the second set of step-wise increasing program voltages.

The programming pass may step up Vpgm in each program loop, after the first loop, in a process referred to as incremental step pulse programming (ISPP). The step size is dVpgm1. The programming pass may also perform verify tests based on the program loop. For example, the A, B and C state cells are verified in loops 2-6, 5-9 and 7-12, respectively. An example verify waveform 920 comprises an A state verify voltage at VvAe. An example verify waveform 921 comprises A and B state verify voltages at VvAe and VvBe, respectively. An example verify waveform 922 comprises B and C state verify voltages at VvBe and VvCe, respectively. An example verify waveform 923 comprises a C state verify voltage at VvCe. The program voltages 901 (with amplitude Vpgm_init1), 902, 903, 904, 905, 906, 907, 908, 909, 910, 911 and 912 are also depicted.

FIG. 9B depicts voltages applied to another word line in a programming operation, consistent with FIG. 8C. The programming pass comprises a series of waveforms 930 including program voltages and verify voltages. The step size is dVpgm2. The programming pass may perform verify tests based on the program loop. For example, the A, B and C state cells are verified in loops 1-4, 3-7 and 5-9, respectively. An example verify waveform 940 comprises an A state verify voltage at VvA. An example verify waveform 941 comprises A and B state verify voltages at VvA and VvB, respectively. An example verify waveform 942 comprises B and C state verify voltages at VvB and VvC, respectively. An example verify waveform 943 comprises a C state verify voltage at VvC. The program voltages 931 (with amplitude Vpgm_init2), 932, 933, 934, 935, 936, 937 and 938 are also depicted.

In FIGS. 10A, 10B, 10C, 11A and 11B, the horizontal axis depicts Vth and the vertical axis depicts a number of memory cell, on a logarithmic scale.

Figure 10A:
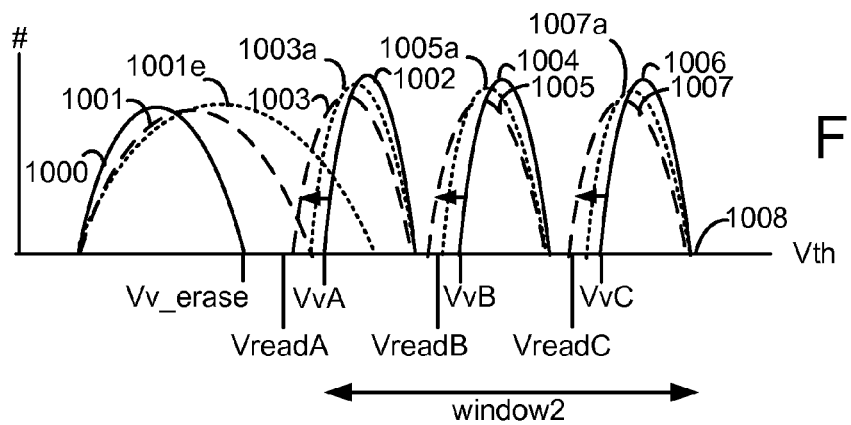
FIG. 10A depicts Vth distributions of a set of memory cells after programming to three target data states, including an increase in the Vth of erased state memory cells due to program disturb and a decrease in the Vth of programmed memory cells due to charge loss.

FIG. 10A depicts Vth distributions of a set of memory cells after programming to three target data states, including an increase in the Vth of erased state memory cells due to program disturb and a decrease in the Vth of programmed memory cells due to charge loss.

A set of memory cells is erased using the verify voltage of Vv_erase to arrive at the Vth distribution 1000. The set of memory cells is subsequently programmed from the erased state to target data states of A, B and C using verify voltages of VvA, VvB and VvC, respectively, in a four state memory device. In other cases, eight, sixteen or more data states are used. The erased state and the A, B and C states are represented by Vth distributions 1000, 1002, 1004 and 1006, respectively. Read voltages of VreadA, VreadB and VreadC are also depicted.

In one approach, the programming involves a single pass in which the memory cells transition from the erased state to the target data state. This programming, also referred to as full sequence programming, minimizes programming time but can result in a high level of program disturb.

After programming, short-term charge loss occurs in the memory cells in the programmed states due to the redistribution of holes in the charge-trapping material of the memory cells, so that the Vth distributions 1002, 1004 and 1006 shift down and widen to become the Vth distributions 1003, 1005 and 1007, respectively, in a first approach. In this first approach, the memory cells of the drain-side edge word line are not programmed before the memory cells of the other word lines.

In a second approach, the memory cells of the drain-side edge word line are programmed before the memory cells of the other word lines. During the programming of the memory cells of the drain-side edge word line, pass voltages (e.g., 8-9 V) which are applied to the memory cells of the remaining word lines act as stress pulses which redistribute holes in the charge-trapping material of the memory cells of the other word lines to reduce short-term charge loss. As a result, the Vth distributions 1002, 1004 and 1006 shift down and widen to a lesser degree (compared to the Vth distributions 1003, 1005 and 1007) to become the Vth distributions 1003a, 1005a and 1007a, respectively.

Additionally, program disturb causes the Vth distribution of the erased state to increase. The amount of increase is greater for the drain-side edge word line than the other word lines due to reduced channel boosting of the memory cells connected to the drain-side edge word line. The Vth distribution 1001e represents the drain-side edge word line and the Vth distribution 1001 represents the other word lines. Further, in this example, the same set of verify levels is used for the drain-side edge word line and the other word lines.

For the remaining word lines, a smaller number of the erased state memory cells of the remaining word lines may be read incorrectly as being A state cells in a read operation using VreadA, compared to the drain-side edge word line. This smaller number can usually be corrected using ECC decoding.

A Vth window, window2, refers to a range of threshold voltages encompassed by the programmed states, e.g., from VvA to the upper tail 1008 of the C state Vth distribution. In this example, the memory cells of the drain-side edge word line and the memory cells of the remaining word lines have a common Vth window.

Figure 10B:
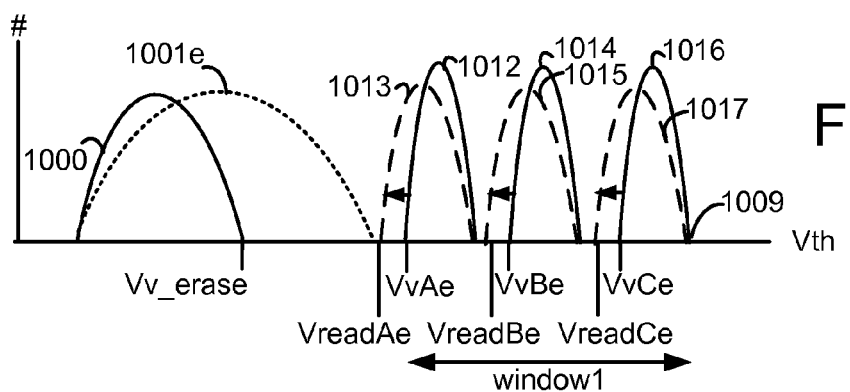
FIG. 10B depicts Vth distributions of a memory cells connected to a drain-side edge word line after programming to three target data states, showing a reduced Vth window compared to FIG. 10A, consistent with FIG. 8B.
Figure 10C:
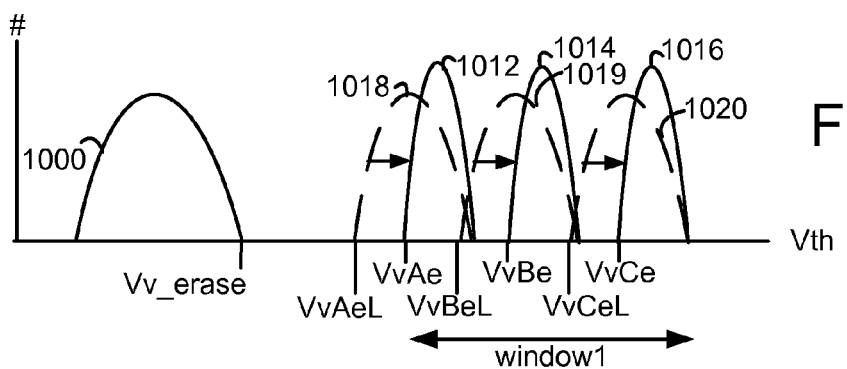
FIG. 10C depicts Vth distributions of a memory cells connected to a drain-side edge word line after programming using fast and slow programming modes, showing a reduced Vth window compared to FIG. 10A, consistent with FIG. 8B.

FIG. 10B depicts Vth distributions of a memory cells connected to a drain-side edge word line after programming to three target data states, showing a reduced Vth window compared to FIG. 10A, consistent with FIG. 8B. This is the above-mentioned second approach. The Vth window, window1, is smaller than window2. This can be achieved, e.g., by raising the lower end of the Vth window. Specifically, a higher verify voltage, VvAe (where "e" denotes the drain-side end word line) can be used for programming memory cells of the drain-side edge word line to the A state, the lowest target data state. VvAe is higher than VvA by an amount dVvA. The verify voltages for the higher target data states can be increased similarly by progressively smaller amounts. For example, VvBe can be higher than VvB by an amount dVvB, and VvCe can be higher than VvC by an amount dVvC, where dVvA>dVvB>dVvC. In another approach, VvCe=VvC. That is, a highest verify voltage (VvCe) of the first set of verify voltages is equal to a highest verify voltage (VvC) of the second set of verify voltages.

The read voltages are also shifter higher compared to FIG. 10A, where VreadAe>VreadA, VreadBe>VreadB and VreadCe>VreadC.

In one approach, the upper tail 1009 of the highest target data state for the memory cells of the drain-side edge word line is approximately the same as the upper tail 1008 of the highest target data state for the memory cells of the remaining word lines.

Since VvAe is higher than VvA, there is a reduced likelihood of erased state cells being read incorrectly as A state cells on the drain-side edge word line. The Vth distributions 1000 and 1001e are repeated in FIGS. 10A and 10B. The memory cells of the drain-side edge word line are programmed from the erased state Vth distribution 1000 to the A, B and C state Vth distributions 1012, 1014 and 1016.

Additionally, during the programming of the memory cells of the drain-side edge word line, one or more of the initial program voltages can act as stress pulses which redistribute holes in the charge-trapping material to reduce short-term charge loss in the memory cells of the drain-side edge word line. As a result, the Vth distributions 1012, 1014 and 1016 shift down and widen to a lesser degree (compared to the Vth distributions 1003, 1005 and 1007) to become the Vth distributions 1013, 1015 and 1017, respectively.

As mentioned, the programming is also adjusted to achieve narrower Vth distributions for each target data state, such as by reducing the initial Vpgm, step size or program pulse width and/or by using a slow programming mode. For example, the Vth window can be reduced by about 1 V by reducing the step size from 0.6 V to 0.4 V.

FIG. 10C depicts Vth distributions of a memory cells connected to a drain-side edge word line after programming using fast and slow programming modes, showing a reduced Vth window compared to FIG. 10A, consistent with FIG. 8B. As mentioned, a slow programming mode can be implemented during programming when the Vth of a memory cells is in a range of voltages between an offset voltage, below a final verify voltage, and the final verify voltage of a target data state. For example, these ranges are VvAeL to VvAe, VvBeL to VvBe and VvCeL to VvCe, for the A, B and C target data states, respectively. Vth distributions 1018, 1019 and 1020 represent the memory cells of the A, B and C target data states, respectively, where some of the memory cells are in the slow programming mode and other memory cells have completed programming. Vth distributions 1012, 1014 and 1016 represent the memory cells of the A, B and C target data states, respectively, where all of the memory cells have completed programming.

An elevated Vbl can be used to slow programming. A fast programming mode can be used for a memory cell which has a Vth below the offset verify voltage of its respective target data state.

Figure 11A:
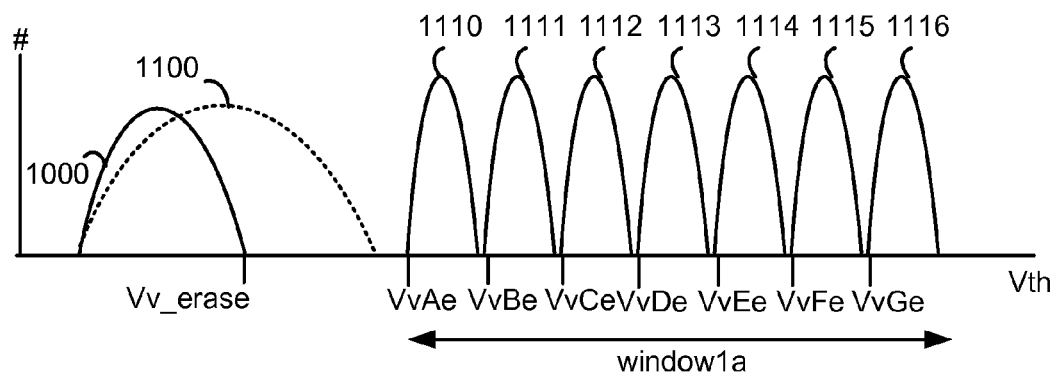
FIG. 11A depicts Vth distributions of a memory cells connected to a drain-side edge word line after programming to seven target data states, consistent with FIG. 8B.

FIG. 11A depicts Vth distributions of a memory cells connected to a drain-side edge word line after programming to seven target data states, consistent with FIG. 8B. The memory cells are initially erased to provide the Vth distribution 1000 and subsequently programmed to provide the Vth distributions 1110, 1111, 1112, 1113, 1114, 1115 and 1116 for the A, B, C, D, E, F and G states, respectively, using verify voltages VvAe, VvBe, VvCe, VvDe, VvEe, VvFe and VvGe, respectively. The Vth window is window1a, which can be equal to or larger than window1 in FIG. 10B, in one approach. The erased state cells transition to a Vth distribution 1100 due to program disturb. The amount of program disturb is proportional to the Vth levels of the highest target data state.

Figure 11B:
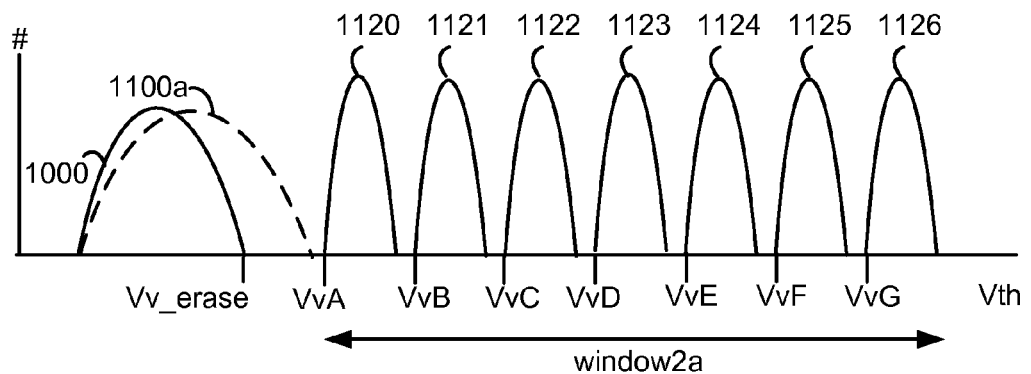
FIG. 11B depicts Vth distributions of a memory cells connected to a non-edge word line after programming to seven target data states, consistent with FIG. 8C.

FIG. 11B depicts Vth distributions of a memory cells connected to a non-edge word line after programming to seven target data states, consistent with FIG. 8C. The memory cells are initially erased to provide the Vth distribution 1000 and subsequently programmed to provide the Vth distributions 1120, 1121, 1122, 1123, 1124, 1125 and 1126 for the A, B, C, D, E, F and G states, respectively, using verify voltages VvA, VvB, VvC, VvD, VvE, VvF and VvG, respectively. The Vth window is window2a, which can be equal to or larger than window2 in FIG. 10A, in one approach. The erased state cells transition to a Vth distribution 1100a due to program disturb. The amount of program disturb is less than in FIG. 11A. For simplicity, the Vth distributions after charge loss are not depicted in FIGS. 11A and 11B.

Figure 12:
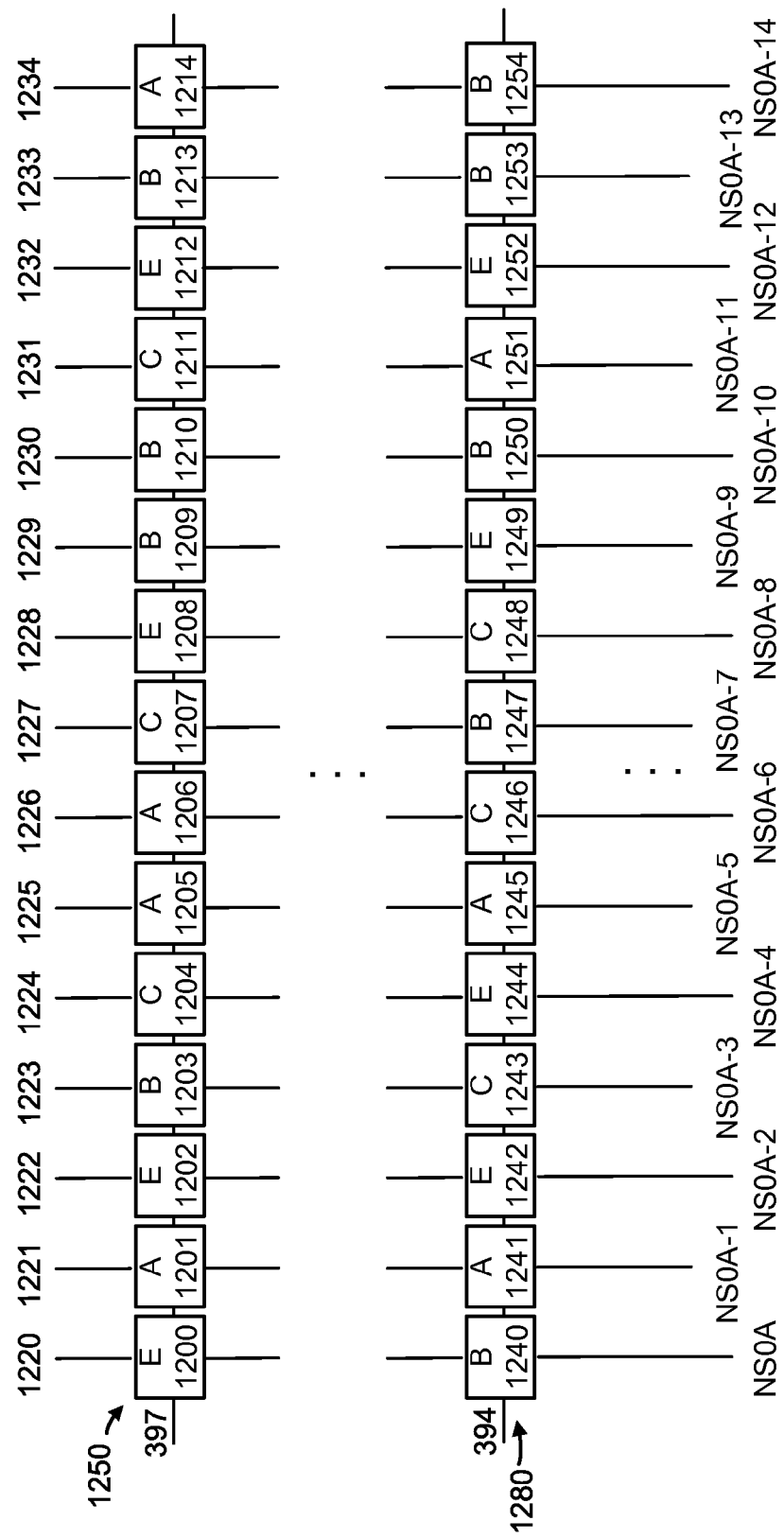
FIG. 12 depicts an example set of memory cells 1250 on a drain-side edge word line 397 and an example set of memory cells 1280 on an example non-edge word line 394.

FIG. 12 depicts an example set of memory cells 1250 on a drain-side edge word line 397, including memory cells 1200-1214, and an example set of memory cells 1280 on an example non-edge word line 394, including memory cells 1240-1254, and associated bit lines 1220-1234, respectively, and NAND strings NS0A-NS0A-14, respectively, consistent with FIGS. 3A and 3D. For example, the memory cells 1240-1254 can be in the region 340 of FIG. 3A. The memory cells are in the E (erased), A state, B state or C state as indicated according to a random distribution of the states. Each memory cell connected to a word line can be in a respective NAND string, for instance, which is associated with a different bit line.

Accordingly, it can be seen that, in one embodiment, a method for programming a memory device comprises: in response to a command to program data in a set of memory cells in a set of NAND strings, where the memory cells are connected to a plurality of word lines extending between a drain-side word line at a drain-end of the set of NAND strings and a source-side word line at a source-side of the set of NAND strings, programming memory cells connected to the drain-side word line to a plurality of target data states using a first set of verify voltages, wherein the memory cells connected to the drain-side word line are programmed before programming memory cells connected to other word lines of the plurality of word lines, and each memory cell of the set of memory cells comprises a charge-trapping material; and subsequently programming memory cells connected to another word line of the plurality of word lines to the plurality of target data states using a second set of verify voltages, wherein a lowest verify voltage of the first set of verify voltages is higher than a lowest verify voltage of the second set of verify voltages.

In another embodiment, a memory device comprises: a set of memory cells in a set of NAND strings, each memory cell of the set of memory cells comprises a charge-trapping material; a plurality of word lines extending between a drain-side word line at a drain-end of the set of NAND strings and a source-side word line at a source-side of the set of NAND strings; and a control circuit. The control circuit is configured to: program memory cells connected to the drain-side word line to a plurality of target data states in a first range of threshold voltages using a first set of verify voltages, and subsequently program memory cells connected to another word line of the plurality of word lines to the plurality of target data states in a second range of threshold voltages using a second set of verify voltages, wherein the first range of threshold voltages is narrower than the second range of threshold voltages.

In another embodiment, a memory controller comprises: a storage device comprising a set of instructions, the set of instructions comprising: instructions to program memory cells connected to a drain-side word line of a plurality of word lines to a plurality of target data states using a first set of verify voltages, wherein the memory cells connected to the drain-side word line are programmed before programming memory cells connected to other word lines of the plurality of word lines; instructions to program memory cells connected to another word line of the plurality of word lines to the plurality of target data states using a second set of verify voltages, wherein a lowest verify voltage of the first set of verify voltages is higher than a lowest verify voltage of the second set of verify voltages; and a processor operable to execute the set of instructions.

In another embodiment, a memory device comprises: a set of memory cells in a set of NAND strings, each memory cell of the set of memory cells comprises a charge-trapping material; a plurality of word lines extending between a drain-side word line at a drain-end of the set of NAND strings and a source-side word line at a source-side of the set of NAND strings; and a control circuit. The control circuit is configured to: program memory cells connected to the drain-side word line to a plurality of target data states using a first set of verify voltages, wherein the memory cells connected to the drain-side word line are programmed before programming memory cells connected to other word lines of the plurality of word lines, and subsequently program memory cells connected to another word line of the plurality of word lines to the plurality of target data states using a second set of verify voltages, wherein a lowest verify voltage of the first set of verify voltages is higher than a lowest verify voltage of the second set of verify voltages.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for programming a memory device, comprising:
   in response to a command to program data in a set of memory cells in a set of NAND strings, where the memory cells are connected to a plurality of word lines extending between a drain-side word line at a drain-end of the set of NAND strings and a source-side word line at a source-side of the set of NAND strings, programming memory cells connected to the drain-side word line to a plurality of target data states using a first set of verify voltages, wherein the memory cells connected to the drain-side word line are programmed before programming memory cells connected to other word lines of the plurality of word lines, and each memory cell of the set of memory cells comprises a charge-trapping material; and
   subsequently programming memory cells connected to another word line of the plurality of word lines to the plurality of target data states using a second set of verify voltages, wherein a lowest verify voltage of the first set of verify voltages is higher than a lowest verify voltage of the second set of verify voltages.

2. The method of claim 1, wherein:
   the plurality of target data states of the memory cells connected to the drain-side word line are in a first range of threshold voltages;
   the plurality of target data states of the memory cells connected to the another word line are in a second range of threshold voltages; and
   the first range of threshold voltages is narrower than the second range of threshold voltages.

3. The method of claim 1, wherein:
   the programming the memory cells connected to the drain-side word line comprises applying a first set of step-wise increasing program voltages to the drain-side word line;
   the programming the memory cells connected to the another word line comprises applying a second set of step-wise increasing program voltages to the another word line; and
   an initial program voltage of the first set of step-wise increasing program voltages is lower than an initial program voltage of the second set of step-wise increasing program voltages.

4. The method of claim 3, wherein:
   a step size of the first set of step-wise increasing program voltages is lower than a step size of the second set of step-wise increasing program voltages.

5. The method of claim 4, wherein:
   a pulse width of the first set of step-wise increasing program voltages is equal to a pulse width of the second set of step-wise increasing program voltages.

6. The method of claim 1, wherein:
the programming the memory cells connected to the drain-side word line comprises applying a first set of step-wise increasing program voltages to the drain-side word line;
the programming the memory cells connected to the another word line comprises applying a second set of step-wise increasing program voltages to the another word line; and
a step size of the first set of step-wise increasing program voltages is lower than a step size of the second set of step-wise increasing program voltages.

7. The method of claim 1, wherein:
prior to the command to program data, the memory cells connected to the drain-side word line and the memory cells connected to the another word line are erased using a common erase verify voltage.

8. The method of claim 1, wherein:
the programming the memory cells connected to the drain-side word line comprises applying a first set of step-wise increasing program voltages to the drain-side word line without performing a verify test using any verify voltage of the first set of verify voltages after an initial program voltage of the first set of step-wise increasing program voltages and before a next program voltage of the first set of step-wise increasing program voltages; and
the programming the memory cells connected to the another word line comprises applying a second set of step-wise increasing program voltages to the another word line and performing a verify test using a lowest verify voltage of the second set of verify voltages after an initial program voltage of the second set of step-wise increasing program voltages and before a next program voltage of the second set of step-wise increasing program voltages.

9. The method of claim 1, wherein:
the set of NAND strings is connected to a set of bit lines;
the programming the memory cells connected to the drain-side word line uses a fast programming mode followed by a slow programming mode for at least one target data state of the plurality of target data states;
the fast programming mode is implemented by a grounded bit line voltage;
the slow programming mode is implemented by an elevated bit line voltage; and
the programming the memory cells connected to the another word line uses the fast programming mode but not the slow programming mode for the at least one target data state of the plurality of target data states.

10. The method of claim 1, wherein the programming the memory cells connected to the drain-side word line comprises applying a set of step-wise increasing program voltages to the drain-side word line, the method further comprising:
applying a pass voltage to the other word lines during each program voltage of the set of step-wise increasing program voltages.

11. A memory device, comprising:
a set of memory cells in a set of NAND strings, each memory cell of the set of memory cells comprises a charge-trapping material;
a plurality of word lines extending between a drain-side word line at a drain-end of the set of NAND strings and a source-side word line at a source-side of the set of NAND strings; and
a control circuit, the control circuit configured to:
program memory cells connected to the drain-side word line to a plurality of target data states in a first range of threshold voltages using a first set of verify voltages, and
subsequently program memory cells connected to another word line of the plurality of word lines to the plurality of target data states in a second range of threshold voltages using a second set of verify voltages, wherein the first range of threshold voltages is narrower than the second range of threshold voltages.

12. The memory device of claim 11, wherein:
a lowest verify voltage of the first set of verify voltages is higher than a lowest verify voltage of the second set of verify voltages.

13. The memory device of claim 11, wherein:
the set of NAND strings is provided in a three-dimensional memory structure; and
the three-dimensional memory structure comprises alternating dielectric and conductive layers; and
the plurality of word lines are provided by the conductive layers.

14. The memory device of claim 11, wherein:
the control circuit, to program the memory cells connected to the drain-side word line, is configured to apply a first set of step-wise increasing program voltages to the drain-side word line and
to program the memory cells connected to the another word line, is configured to apply a second set of step-wise increasing program voltages to the another word line;
an initial program voltage of the first set of step-wise increasing program voltages is lower than an initial program voltage of the second set of step-wise increasing program voltages; and
a step size of the first set of step-wise increasing program voltages is lower than a step size of the second set of step-wise increasing program voltages.

15. The memory device of claim 11, wherein:
the control circuit, to program the memory cells connected to the drain-side word line, is configured to apply a first set of step-wise increasing program voltages to the drain-side word line without performing a verify test using any verify voltage of the first set of verify voltages after an initial program voltage of the first set of step-wise increasing program voltages and before a next program voltage of the first set of step-wise increasing program voltages; and
the control circuit, to program the memory cells connected to the another word line, is configured to apply a second set of step-wise increasing program voltages to the another word line and performing a verify test using a lowest verify voltage of the second set of verify voltages after an initial program voltage of the second set of step-wise increasing program voltages and before a next program voltage of the second set of step-wise increasing program voltages.

* * * * *